US011177311B2

(12) United States Patent
Juen et al.

(10) Patent No.: US 11,177,311 B2

(45) Date of Patent: Nov. 16, 2021

(54) IMAGE SENSOR AND IMAGE CAPTURE DEVICE

(71) Applicant: NIKON CORPORATION, Tokyo (JP)

(72) Inventors: Masahiro Juen, Yokohama (JP); Atsushi Komai, Tokorozawa (JP)

(73) Assignee: NIKON CORPORATION, Tokyo (JP)

( * ) Notice: Subject to any disclaimer, the term of this patent is extended or adjusted under 35 U.S.C. 154(b) by 335 days.

(21) Appl. No.: 16/086,341

(22) PCT Filed: Feb. 28, 2017

(86) PCT No.: PCT/JP2017/007935

§ 371 (c)(1),
(2) Date: Oct. 26, 2018

(87) PCT Pub. No.: WO2017/169478

PCT Pub. Date: Oct. 5, 2017

(65) Prior Publication Data

US 2019/0043913 A1 Feb. 7, 2019

(30) Foreign Application Priority Data

Mar. 29, 2016 (JP) ............................ JP2016-065490

(51) Int. Cl.

*H01L 27/14* (2006.01)
*H01L 27/146* (2006.01)

(Continued)

(52) U.S. Cl.

CPC ...... *H01L 27/14643* (2013.01); *H01L 27/146* (2013.01); *H01L 27/14612* (2013.01);

(Continued)

(58) Field of Classification Search

CPC ......... H01L 27/14609; H01L 27/14612; H01L 27/14643; H04N 5/357; H04N 5/3575; H04N 5/363; H04N 5/365; H04N 5/378

See application file for complete search history.

(56) References Cited

U.S. PATENT DOCUMENTS

2004/0085465 A1 5/2004 Inui et al.
2005/0018065 A1 1/2005 Tashiro et al.

(Continued)

FOREIGN PATENT DOCUMENTS

EP 2840780 A1 2/2015
JP 2001-045375 A 2/2001

(Continued)

OTHER PUBLICATIONS

Apr. 14, 2020 Office Action issued in Japanese Patent Application No. 2018-508831.

(Continued)

*Primary Examiner* — Kevin K Pyo

(74) *Attorney, Agent, or Firm* — Oliff PLC

(57) ABSTRACT

An image sensor includes: a plurality of pixels having photoelectric conversion units that convert incident light to charges, and readout units; a first signal line, connected to the plurality of pixels, that outputs a first signal transferred to the readout unit based upon the charge converted by the photoelectric conversion unit; and a second signal line, connected to the plurality of pixels, that outputs a second signal after the readout unit has been reset.

12 Claims, 14 Drawing Sheets

(51) Int. Cl.
*H04N 5/378* (2011.01)
*H04N 5/357* (2011.01)

(52) U.S. Cl.
CPC ............. *H04N 5/357* (2013.01); *H04N 5/378* (2013.01); *H01L 27/1464* (2013.01)

(56) References Cited

U.S. PATENT DOCUMENTS

2005/0168618 A1 8/2005 Okita et al.
2009/0322903 A1 12/2009 Hashimoto et al.
2012/0182455 A1 7/2012 Gomi et al.
2013/0153752 A1 6/2013 Sakurai
2015/0029375 A1 1/2015 Sugawa et al.
2015/0103219 A1 4/2015 Kasuga et al.
2020/0389609 A1* 12/2020 Komai ................. H04N 5/3559

FOREIGN PATENT DOCUMENTS

JP 2002-344809 A 11/2002
JP 2008-295078 A 12/2008
JP 2010-016416 A 1/2010
JP 2012-134987 A 7/2012
JP 2012-151596 A 8/2012
JP 2013-126174 A 6/2013
WO 2013/157407 A1 10/2013
WO 2014/002333 A1 1/2014

OTHER PUBLICATIONS

Aug. 7, 2020 Office Action issued in Japanese Patent Application No. 2018-508831.
May 25, 2020 Office Action issued in Chinese Patent Application No. 201780029974.4.
Oct. 25, 2019 Search Report issued in European Patent Application No. 17774023.0.
Nov. 12, 2019 Office Action issued in Japanese Patent Application No. 2018-508831.
May 16, 2017 International Search Report issued in International Patent Application No. PCT/JP2017/007935.
Apr. 13, 2021 Notice of Reasons for Refusal issued in Japanese Patent Application No. 2018-508831.
Nov. 26, 2020 Office Action issued in European Patent Application No. 17774023.0.
Feb. 1, 2021 Office Action issued in Chinese Patent Application No. 201780029974.4.
Jul. 12, 2021 Office Action issued in Chinese Patent Application No. 201780029974.4.
Sep. 7, 2021 Office Action issued in Japanese Patent Application No. 2020-120952.

* cited by examiner

IMAGE SENSOR AND IMAGE CAPTURE DEVICE

TECHNICAL FIELD

The present invention relates to an image sensor and to an image capture device.

BACKGROUND ART

An image sensor is per se known (refer to Patent Document #1) in which, due to the provision of a plurality of capacitors to one pixel column, while reading out signals from pixels of some row, horizontal transfer of pixels in other rows is possible. However, with this prior art technique, there is a risk that the chip area of the image capture area will be increased, since it is necessary to provide a large number of capacitors.

CITATION LIST

Patent Literature

Patent Document #1: Japanese Laid-Open Patent Publication 2001-45375.

SUMMARY OF INVENTION

According to the 1st aspect of the present invention, an image sensor, comprises: a plurality of pixels having photoelectric conversion units that convert incident light to charges, and readout units; a first signal line, connected to the plurality of pixels, that outputs a first signal transferred to the readout unit based upon the charge converted by the photoelectric conversion unit; and a second signal line, connected to the plurality of pixels, that outputs a second signal after the readout unit has been reset.

According to the 2nd aspect of the present invention, an image sensor, comprises: a plurality of pixels having photoelectric conversion units that convert incident light to charges, arranged along a first direction; a signal line, connected to the plurality of pixels, and to which is outputted a signal from the pixel generated by charge converted by the photoelectric conversion unit; and a capacitance that stores the signal outputted to the signal line, and due to a conductor that constitutes the signal line and another conductor.

According to the 3rd aspect of the present invention, an image capture device, comprises: an image sensor according to the 1st or 2nd aspect; and an image generation unit that generates image data based upon a signal from the image sensor.

DESCRIPTION OF EMBODIMENTS

The First Embodiment

Figure 1:
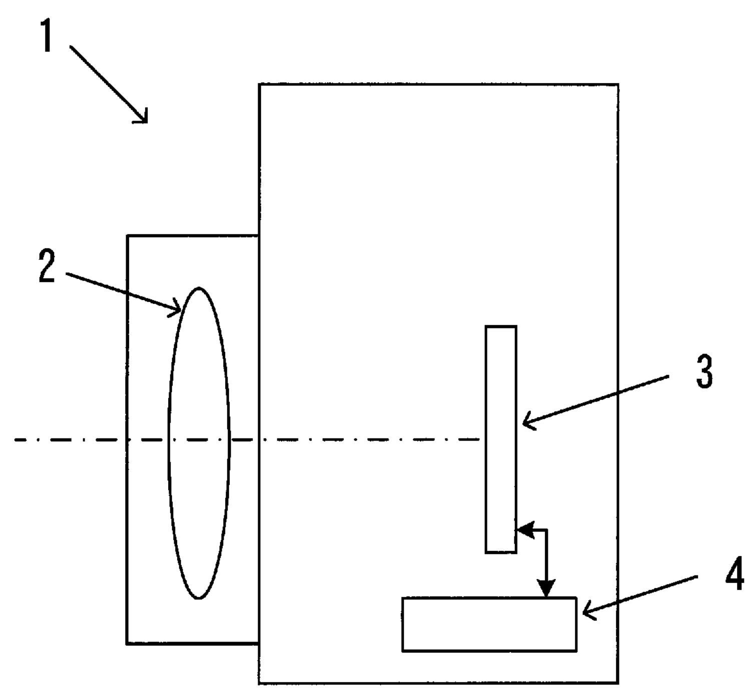
FIG. 1 is a block diagram showing the structure of an image capture device according to a first embodiment.

FIG. 1 is a block diagram showing the structure of an image capture device 1 according to the first embodiment. The image capture device 1 comprises a photographic optical system 2, an image sensor 3, and a control unit 4. This image capture device 1 may, for example, be a camera. The photographic optical system 2 focuses an image of a photographic subject upon the image sensor 3. The image sensor 3 generates an image signal by capturing the image of the photographic subject that has been generated by the photographic optical system 2. The image sensor 3 may, for example, be a CMOS image sensor. The control unit 4 outputs a control signal to the image sensor 3 for controlling the operation of the image sensor 3. Moreover, the control unit 4 functions as an image generation unit that generates image data by performing image processing of various kinds upon the image signal outputted from the image sensor 3. It should be understood that it would also be acceptable to arrange for the photographic optical system 2 to be interchangeable from the image capture device 1.

Figure 2:
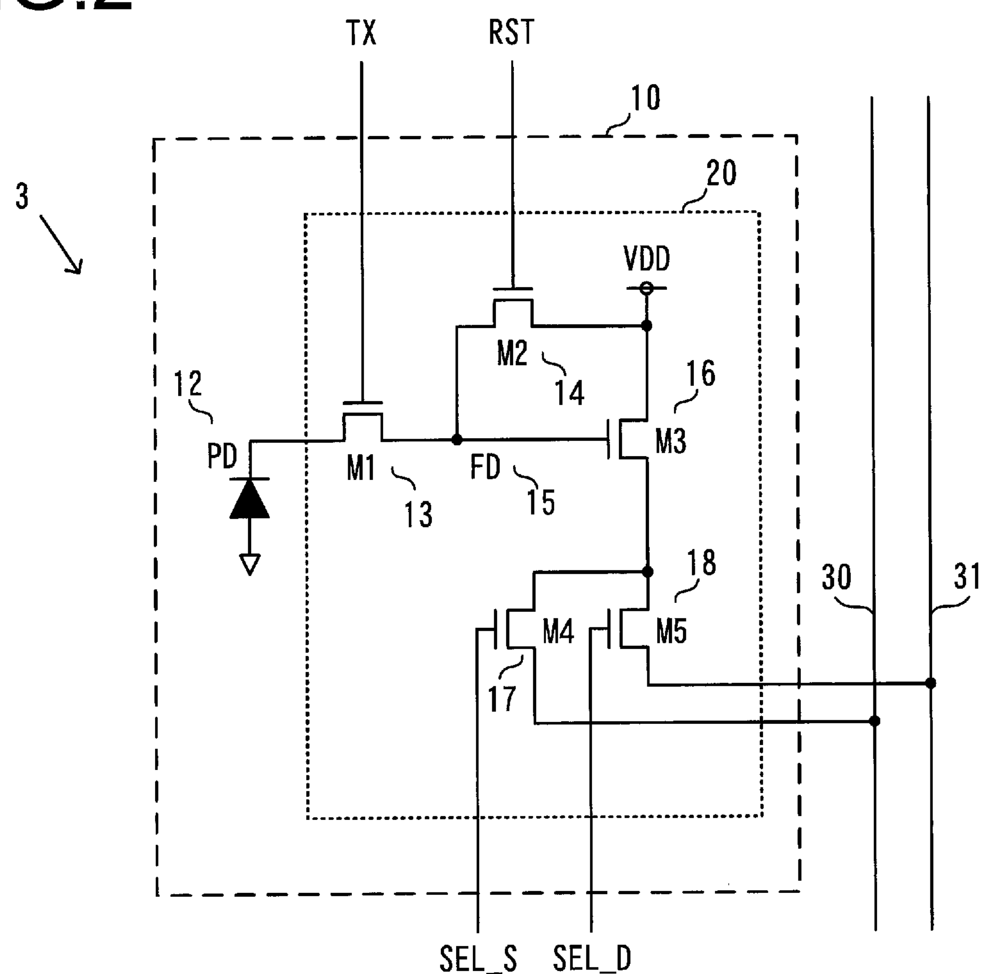
FIG. 2 is a circuit diagram showing the structure of a pixel according to this first embodiment.

FIG. 2 is a circuit diagram showing the structure of a pixel 10 according to the first embodiment. The image sensor 3 includes a plurality of pixels 10, arranged in a two dimensional array. The pixel 10 comprises a photoelectric conversion unit 12, such as for example a photodiode (PD) or the like, and a readout unit 20. The photoelectric conversion unit 12 has a function of converting incident light into electric charge, and of accumulating the electric change that has thus been photoelectrically converted. And the readout unit 20 comprises a transfer unit 13, a discharge unit 14, a floating diffusion (FD) 15, an amplification unit 16, a first selection switch unit 17, and a second selection switch unit 18.

The transfer unit 13 is controlled by a signal TX, and transfers the electric charge that has been photoelectrically converted by the photoelectric conversion unit 12 to the floating diffusion 15. In other words, the transfer unit 13 constitutes a charge transfer path between the photoelectric conversion unit 12 and the floating diffusion 15. The floating diffusion 15 stores (i.e. accumulates) electric charge. And the amplification unit 16 amplifies the signal due to the electric charge stored in the floating diffusion 15 and outputs it. The amplification unit 16 is connected to a first vertical signal line 30 via a first selection switch unit 17, and is connected to a second vertical signal line 31 via the first selection switch unit 18. The amplification unit 16 functions as a part of a source follower circuit that serves as a load current source for a current source 60 (refer to FIG. 3) which will be described hereinafter.

The discharge unit (i.e. the reset unit) 14 is controlled by a signal RST, and discharges the charge of the floating diffusion 15, thus resetting the potential of the floating diffusion 15 back to a reset potential (i.e. a reference potential). The first selection switch unit 17 is controlled by a signal SEL_S, and outputs the signal from the amplification unit 16 to the first vertical signal line 30. The second selection switch unit 18 is controlled by a signal SEL_D, and outputs the signal from the amplification unit 16 to the second vertical signal line 31. The transfer unit 13, the discharge unit 14, the amplification unit 16, the first selection switch unit 17, and the second selection switch unit 18 respectively comprise, for example, a transistor M1, a transistor M2, a transistor M3, a transistor M4, and a transistor M5.

The readout unit 20 reads out a signal, which corresponds to the charge transferred by the transfer unit 13 from the photoelectric conversion unit 12 to the floating diffusion 15 (i.e. the photoelectrically converted signal), via the first selection switch unit 17 to the first vertical signal line 30. Moreover, the readout unit 20 reads out the signal when the potential of the floating diffusion 15 is reset to the reset potential by the discharge unit 14 (i.e. a noise signal), via the second selection switch unit 18 to the second vertical signal line 31.

Figure 3:
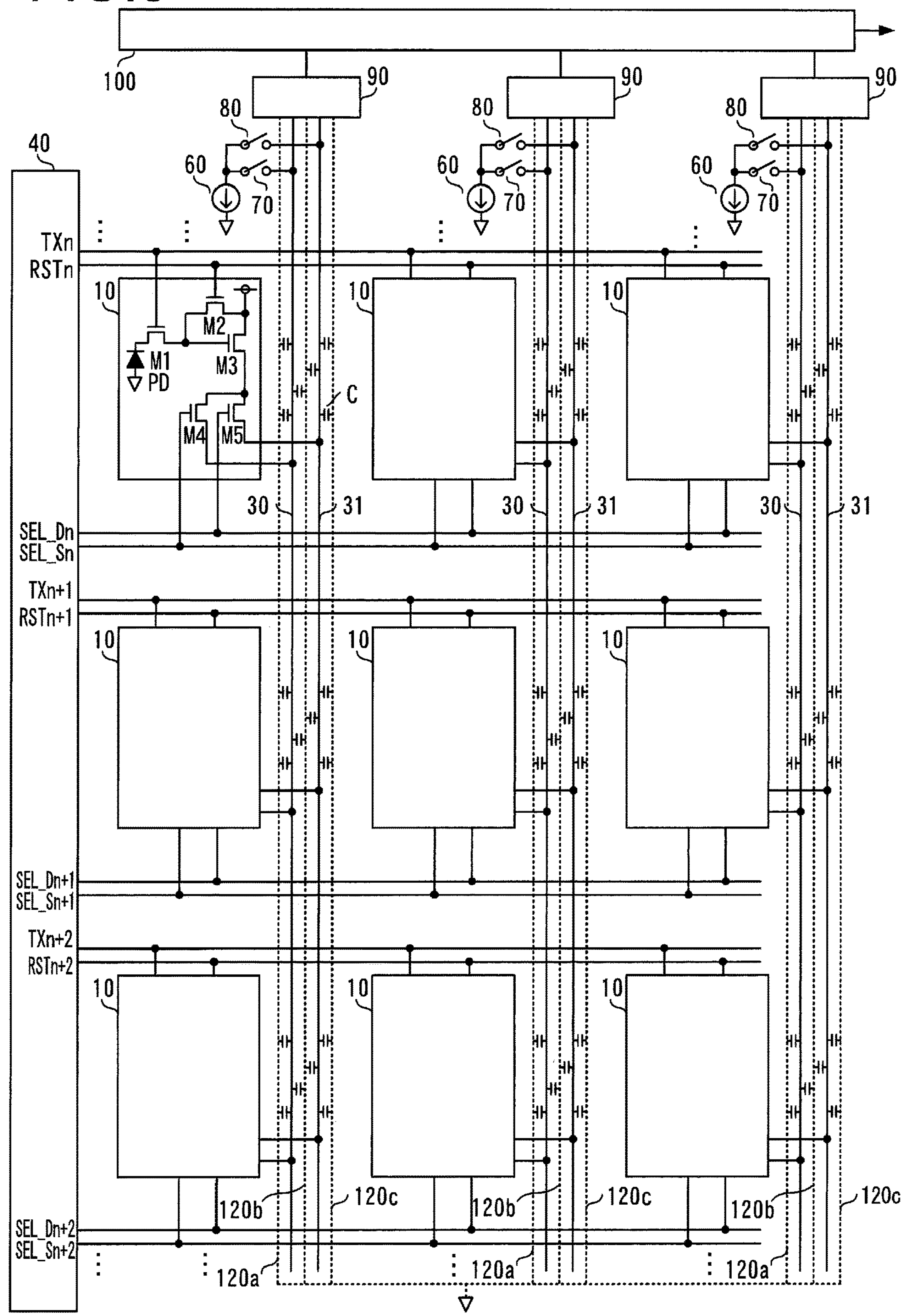
FIG. 3 is a circuit diagram showing the structure of a part of an image sensor according to the first embodiment.

FIG. 3 is a circuit diagram showing the structure of a part of this image sensor 3 according to the first embodiment. The image sensor 3 comprises the plurality of pixels 10 arranged in the form of a matrix, a vertical scanner circuit 40, current sources 60, first switch units 70, second switch units 80, column circuits 90, and a horizontal signal output circuit 100. A first vertical signal line 30, a second vertical signal line 31, a current source 60, a first switch unit 70, and a second switch unit 80 are provided for each of the pixel columns consisting of a plurality of the pixels 10 arranged along the vertical direction, in other words along the column direction. In other words, a first vertical signal line 30, a second vertical signal line 31, a current source 60, a first switch unit 70, and a second switch unit 80 are provided corresponding to the first pixel column along the left edge of FIG. 3, and, in a similar manner, a first vertical signal line 30, a second vertical signal line 31, a current source 60, a first switch unit 70, and a second switch unit 80 are provided corresponding to the second pixel column to the right of the abovementioned first pixel column, and likewise the same are provided corresponding to the third pixel column to the right of the abovementioned second pixel column. It should be understood that, in the interests of brevity of explanation, only three pixels 10 along the horizontal direction and three pixels along the vertical direction are shown in FIG. 3.

In this embodiment, as described above, a first vertical signal line 30 and a second vertical signal line 31 are provided for each of the pixel columns. The photoelectrically converted signal from each of the pixels 10 is read out to its first vertical signal line 30, while the noise signal from each of the pixels 10 is read out to its second vertical signal line 31. Each of the first vertical signal line 30 and the second vertical signal line 31 is connected to a plurality of pixels 10 that are arranged in the vertical direction, and the signals read out from the pixels 10 are transmitted to peripheral circuitry (the column circuits 90 and so on) disposed around the periphery of the region where the pixels 10 are densely arranged in the form of a matrix. The first vertical signal line 30 and the second vertical signal line 31 have large capacitances, corresponding to their lengths and so on. Due to this, it is possible to employ the first vertical signal line 30 as a capacitor that stores (i.e. accumulates) the photoelectrically converted signals, and it is possible to employ the second vertical signal line 31 as a capacitor that stores (i.e. accumulates) the noise signals. As a result, it is possible to obtain large values of capacitance without causing any increase of the chip area.

As shown in FIG. 3, one of the first vertical signal lines 30 is provided to correspond to each column of the pixels 10, and this line accumulates the photoelectrically converted signals outputted from each of those pixels 10. Moreover, one of the second vertical signal lines 31 is provided to correspond to each column of the pixels 10, and this line accumulates the noise signals outputted from each of those pixels 10. The first vertical signal line 30 and the second vertical line 31 each possesses a capacitance (i.e. a wiring capacitance) that accumulate, respectively, the photoelectrically converted signals and the noise signals. These capacitances are, for example, capacitances created due to the conductors and capacitances created due to neighboring metallic objects and so on. It should be understood that the details of the structure of the first vertical signal line 30 and the second vertical signal line 31 will be explained hereafter with reference to FIG. 4.

In this image sensor 3, wiring for shielding is provided in order to suppress mixing of noise into the signals inputted to the first vertical signal line 30 and to the second vertical signal line 31. For example, the first, second, and third shield lines 120*a*, 120*b*, and 120*c* shown in FIG. 3 may be provided as wiring for shielding. It should be understood that, in FIG. 3, the first, second, and third shield lines 120*a*, 120*b*, and 120*c* are shown by dotted lines, in order to distinguish them from the first vertical signal line 30 and the second vertical signal line 31. For example, a fixed potential (for example power supply potential or ground potential) may be applied to the first, second, and third shield lines 120*a*, 120*b*, and 120*c*. In other words, the first, second, and third shield lines 120*a*, 120*b*, and 120*c* are wiring to which constant potentials are applied. The first, second, and third shield lines 120*a*, 120*b*, and 120*c* may also be termed electrodes to which constant potentials are applied. In the example shown in FIG. 3, ground potential is applied to the first, second, and third shield lines 120*a*, 120*b*, and 120*c*. Moreover, capacitances are created between the first and second shield lines 120*a* and 120*b* and the first vertical signal line 30, and between the second and third shield lines 120*b* and 120*c* and the second vertical line 31. The reference sign C denoting capacitance shown in FIG. 3 is for schematically indicating that capacitances are created between the first and second shield lines 120*a* and 120*b* and the first vertical signal line 30, and between the second and third shield lines 120*b* and 120*c* and the second vertical line 31.

Furthermore, in the circuit diagram of FIG. 3, for ease of understanding, the first vertical signal line 30, the second vertical signal line 31, and the first, second, and third shield lines 120*a*, 120*b*, and 120*c* are drawn as extending beside the pixels 10. However, in practice, the first vertical signal line 30, the second vertical signal line 31, and the first, second, and third shield lines 120*a*, 120*b*, and 120*c* are provided as laminated upon the semiconductor substrate in the pixel region. In other words, one set of a first vertical signal line 30, a second vertical signal line 31, and first, second, and third shield lines 120*a*, 120*b*, and 120*c* is disposed in the pixel region in which the first pixel column is disposed, another set is disposed in the pixel region in which the second pixel column is disposed, and another set is disposed in the pixel region in which the third pixel column is disposed. In this embodiment, as will be described in detail hereinafter with reference to FIG. 4, a backside-illuminated type image sensor is employed, and the first vertical signal lines 30, the second vertical signal lines 31, and the first, second, and third shield lines 120*a*, 120*b*, and 120*c* are disposed as laminated upon the semiconductor substrate in the pixel regions. By employing the vertical signal lines also as capacitors in this manner, it is possible to obtain high values of capacitance without entailing increase of the chip area, and furthermore it becomes possible to reduce the chip area by employing a backside-illuminated type image sensor.

The current source 60 shown in FIG. 3 is provided to correspond to the first vertical signal line 30 and to the second vertical signal line 31, and is connected to the first vertical signal line 30 via the first switch unit 70 and is also connected to the second vertical signal line 31 via the second switch unit 80. Moreover, the current source 60 is connected to the pixels 10 via the first vertical signal line 30 and the second vertical signal line 31. The current source 60 generates current for reading out the photoelectrically converted signals and the noise signals from the pixels 10, and supplies the current that is generated to the first vertical signal line 30 and to the second vertical signal line 31 and thence to the pixels 10.

The vertical scanner circuit 40 supplies the control signals such as the signal Txn, the signal RSTn, the signal SEL_Sn, the signal SEL_Dn and so on to each of the pixels 10. The vertical scanner circuit 40 outputs the signals TXn and so on to each of the pixels 10, and controls the operation of each of the pixels 10. It should be understood that the "n" at the tail end of each of the symbols "Txn", "RSTn", "SEL_Sn", and "SEL_Dn" represents the row number of its pixel. For example, the signal TXn is the signal that controls the transfer units 13 of the pixels 10 in the n-th row.

The first switch unit 70 is provided corresponding to the first vertical signal line 30, and is connected to the first vertical signal line 30. The first switch unit 70 is controlled by a control signal outputted from the vertical scanner circuit 40 (i.e. by a signal Vsws), and changes over the state of electrical connection between the first vertical signal line 30 and the current source 60. The first switch unit 70 consists of, for example, a transistor. The second switch unit 80 is provided corresponding to the second vertical signal line 31, and is connected to the second vertical signal line 31. The second switch unit 80 is controlled by a control signal outputted from the vertical scanner circuit 40 (i.e. by a signal Vswd), and changes over the state of electrical connection between the second vertical signal line 31 and the current source 60. The second switch unit 80 consists of, for example, a transistor.

The column circuit 90 includes an analog/digital conversion unit (i.e. an A/D conversion unit), and converts the photoelectrically converted signal and the noise signal to digital signals. The column circuit 90 converts the photoelectrically converted signal inputted via the first vertical signal line 30 to a digital signal, which it outputs to the horizontal signal output circuit 100. Moreover, the column circuit 90 converts the noise signal inputted via the second vertical signal line 31 to a digital signal, which it outputs to the horizontal signal output circuit 100. The horizontal signal output circuit 100 sequentially outputs the digital signal corresponding to the noise signal and the digital signal corresponding to the photoelectrically converted signal, inputted from the column circuit 90, to a signal processing unit of a subsequent stage (not shown in the figures). Using the results of A/D conversion, signal processing such as correlated double sampling and processing for correction of the amounts of the signals and so on is performed by the signal processing unit.

Figure 4:
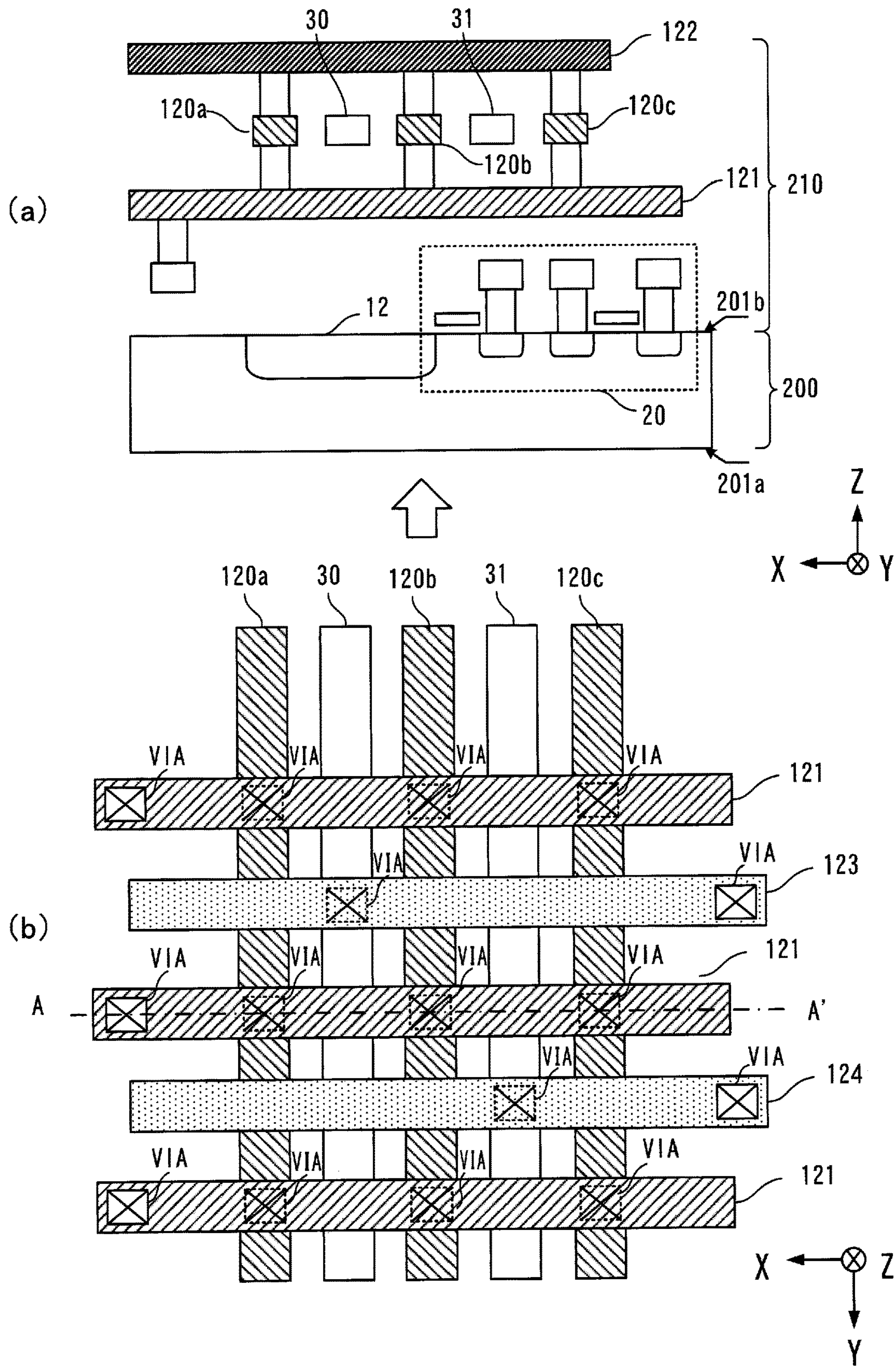
FIG. 4 is a figure showing an example of the cross sectional structure of the image sensor according to the first embodiment.

FIG. 4 is a figure for explanation of the cross sectional structure of the image sensor 3 according to the first embodiment. FIG. 4(*a*) is a figure showing an example of the cross sectional structure of the image sensor 3. And FIG. 4(*b*) is a figure showing an example of the layout of a part of the wiring of a wiring layer 210. It should be understood that FIG. 4(*a*) is a sectional view along A-A' in FIG. 4(*b*), and FIG. 4(*b*) is a figure showing a portion of the wiring of the wiring layer 210 as seen from the side of the semiconductor substrate 200. This image sensor 3 is, for example, a backside-illuminated type image sensor. As shown in FIG. 4, the incident light is principally incident along the +Z axis direction. Moreover, as shown in the figures by the coordinate axes, the direction leftward along the drawing paper and perpendicular to the Z axis is the +X axis direction, and the direction perpendicular to the drawing paper and away from the viewer is the +Y axis direction.

The image sensor 3 includes the semiconductor substrate 200 which is made from a semiconducting material such as silicon or the like, and the wiring layer 210 which is laminated upon the semiconductor substrate 200. The image sensor 3 further includes a micro-lens layer, color filter layer, and a passivation layer, none of which are shown in the figures. In this image sensor 3, for example, the micro-lens layer, the color filter layer, the passivation layer, the semiconductor substrate 200, and the wiring layer 210 are arranged in that order along the +Z axis direction.

The semiconductor substrate 200 comprises a first surface 201*a* which is an incident surface upon which light is incident, and a second surface 201*b* which is different from the first surface 201*a*. The second surface 201*b* is positioned on the opposite side from the first surface 201*a*. In this embodiment, the rear surface of the image sensor 3 shows the first surface 201*a* which is positioned on the opposite side to the wiring layer 210, and the fact that this image sensor is of the backside-illumination type implies that the light is incident from the first surface 201*a*, which constitutes the rear surface. In this semiconductor substrate 200, the photoelectric conversion units 12 and the readout units 20 are provided between the first surface 201*a* and the second surface 201*b*. The plurality of the pixels 10 having the photoelectric conversion units 12 and the readout units 20 are arranged along the X axis direction and along the Y axis direction.

The first vertical signal line 30, the second vertical signal line 31, the first, second, and third shield lines 120*a*, 120*b*, and 120*c*, connecting shield line 121, and mesh shielding line 122 are arranged in the wiring layer 210, and are each implemented with a conducting film. The first vertical signal line 30 is provided between the neighboring first and second shield lines 120*a* and 120*b*, and the second vertical signal line 31 is provided between the neighboring second and third shield lines 120*b* and 120*c*. The first, second, and third shield lines 120*a*, 120*b*, and 120*c* are parallel shield lines that are arranged to extend parallel to the first vertical signal line 30 and the second vertical signal line 31. The mesh shielding line 122 is a shielding line that is formed in a mesh shape. Moreover, the mesh shielding line 122 is formed so as to cover the entire pixel region of the pixel column shown in FIG. 3. The mesh shielding line 122 and the first, second, and third shield lines 120*a*, 120*b*, and 120*c* are connected by a plurality of vias, and the first, second, and third shield lines 120*a*, 120*b*, and 120*c* and the connecting shield line 121 are connected by a plurality of vias.

The mesh shielding line 122, the first, second, and third shield lines 120*a*, 120*b*, and 120*c*, and the connecting shield line 121 are supplied with a fixed potential (for example ground potential). By the mesh shielding line 122, the first, second, and third shield lines 120*a*, 120*b*, and 120*c*, and the connecting shield line 121 being provided so as to surround each of the first vertical signal line 30 and each of the second vertical signal line 31, they function as shields between each of the first vertical signal lines 30 and each of the second vertical signal lines 31. Thus, it is possible to avoid the occurrence of large parasitic capacitances between each of the first vertical signal lines 30 and each of the second vertical signal lines 31, and it is possible to suppress crosstalk between each of the first vertical signal lines 30 and each of the second vertical signal lines 31.

A connection line 123 shown in FIG. 4(*b*) is a connection line that connects the first vertical signal line 30 to the pixel 10 with vias (VIA). And a connection line 124 is a connection line that connects the second vertical signal line 31 to the pixel 10 with vias (VIA). Connecting shield lines 121 are provided on both sides of the connection line 123 and also of the connection line 124 so as to sandwich them, and these function as shields between the connection line 123 and the connection line 124.

Layers of insulation are provided between each of the first vertical signal line 30 and the second vertical signal line 31, and the mesh shielding line 122, the first, second, and third shield lines 120*a*, 120*b*, and 120*c*, and the connecting shield line 121. These insulation layers may be oxidized film or nitride film or the like. In more concrete terms, they may be made from silicon oxide film, silicon nitride film, or silicon oxy-nitride film, or they may be made from a multi-layer film incorporating several such films. Capacitances are created between each of the first vertical signal line 30 and the second vertical signal line 31, and the mesh shielding line 122, the first, second, and third shield lines 120*a*, 120*b*, and 120*c*, and the connecting shield line 121. It should be understood that capacitors created between each of the first vertical signal line 30 and the second vertical signal line 31, and other lines different form the first, second, and third shield lines 120*a*, 120*b*, and 120*c* and so on may also be added to the first vertical line 30 and the second vertical line 31.

Figure 5:
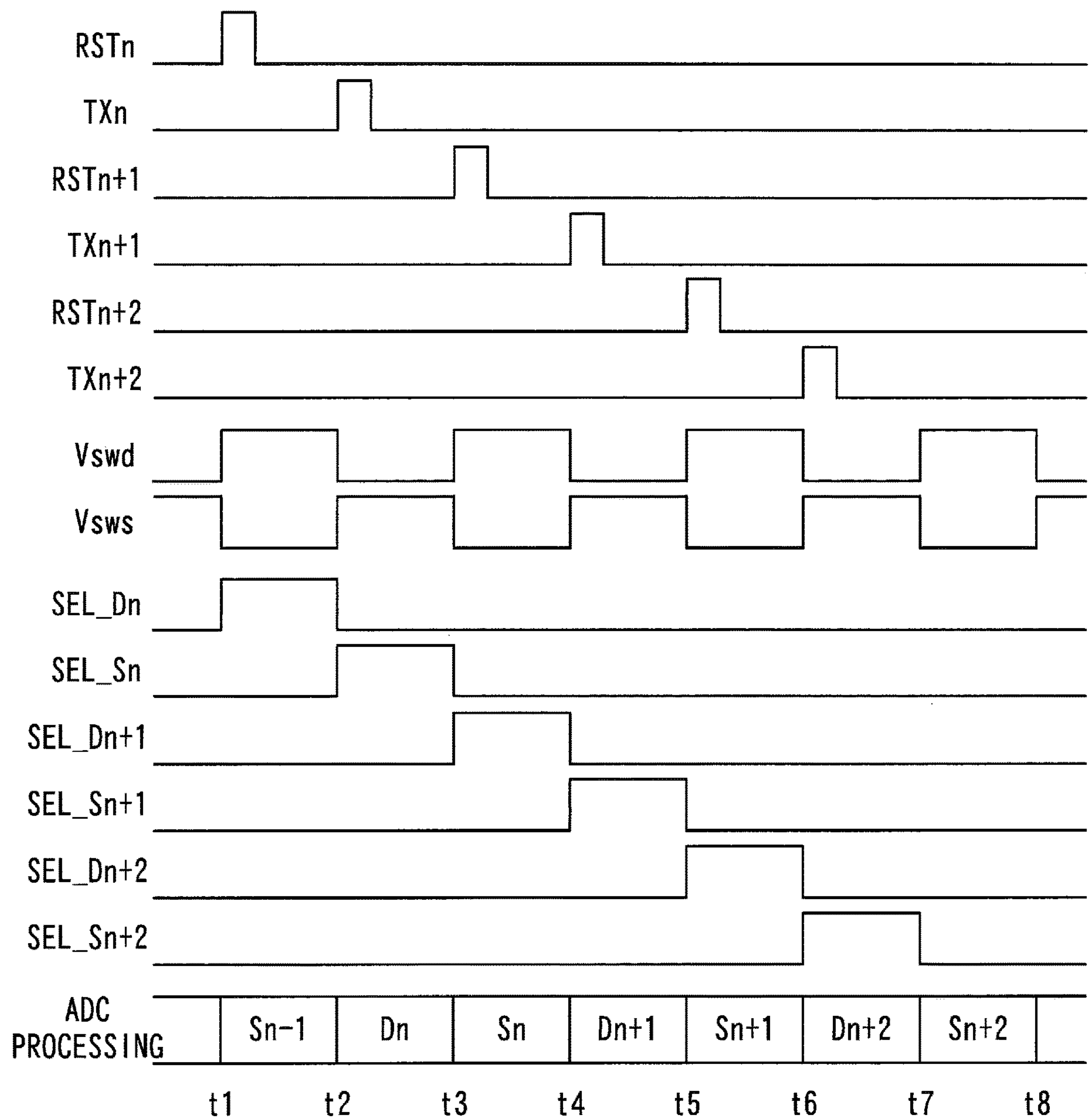
FIG. 5 is a timing chart showing an example of operation of the image sensor according to the first embodiment.

FIG. 5 is a timing chart showing an example of operation of the image sensor 3 according to the first embodiment. In FIG. 5, time is shown along the horizontal axis. In the timing chart shown in FIG. 5, when any one of the control signals is at high level (for example, power supply potential), a transistor to which that control signal is inputted is in the ON state, whereas, when the control signal is at low level (for example, ground potential), the transistor to which the control signal is inputted is in the OFF state. It should be understood that the signal Vswd shown in FIG. 5 is the control signal that is inputted to the second switch units 80, while the signal Vsws is the control signal that is inputted to the first switch units 70.

At the time point t1, due to the signal RSTn going to high level, the transistor M2 of the discharge unit 14 of each of the pixels 10 of the n-th row goes to ON. Because of this, the potentials of the floating diffusions 15 go to the reset potential. Moreover, at this time point t1, the signal Vswd and the signal SEL_Dn both go to high level, so that the second switch units 80 and the second selection switch units 18 go to ON, and current from the current sources 60 is supplied to the second vertical signal lines 31 and to the amplification units 16. Moreover, the noise signal from each of the pixels 10 of the n-th row is outputted to the corresponding second vertical signal line 31 by the corresponding amplification unit 16 and the corresponding second selection switch unit 18. The capacitance possessed by the second vertical signal line 31 accumulates (i.e. stores) these noise signals.

At the time point t2, due to the signal TXn going to high level, the transistor M1 of the transfer unit 13 of each of the pixels 10 of the n-th row goes to ON. Because of this, the charges that have been photoelectrically converted by their photoelectric conversion units 12 are transferred to their floating diffusions 15. Moreover, at this time point t2, the signal Vsws and the signal SEL_Sn both go to high level, and, by the signal Vswd and the signal SEL_Dn both going to low level, the first switch units 70 and the first selection switch units 17 go to ON, while the second switch units 80 and the second selection switch units 18 go to OFF. Due to this, current from the current sources 60 is supplied to the first vertical signal lines 30 and to the amplification units 16. Moreover, the photoelectrically converted signal from each of the pixels 10 of the n-th row is outputted to the corresponding first vertical signal line 31 by the corresponding amplification unit 16 and the corresponding first selection switch unit 17. The capacitances possessed by the first vertical signal lines 30 accumulate (i.e. store) the photoelectrically converted signals. Furthermore, in the interval from the time point t2 to the time point t3, the noise signal from each of the pixels 10 of the n-th row that has been stored in the corresponding second vertical signal line 31 is outputted to the corresponding column circuit 90. And the column circuits 90 perform processing for converting the noise signals from each of the pixels 10 of the n-th row into digital signals.

At the time point t3, due to the signal RST(n+1) going to high level, for each of the pixels 10 of the (n+1)-th row, the potential of its floating diffusion 15 goes to the reset potential. Moreover, at this time point t3, due to the signal Vswd and the signal SEL_D(n+1) both going to high level, the noise signal from each of the pixels 10 of the (n+1)-th row is outputted to the corresponding second vertical signal line 31. The capacitances possessed by the second vertical signal lines 31 accumulate (i.e. store) these noise signals. Furthermore, in the interval from the time point t3 to the time point t4, the photoelectrically converted signal from each of the pixels 10 of the n-th row that has been stored in the corresponding first vertical signal line 30 is outputted to the corresponding column circuit 90, and is converted by that column circuit into a digital signal.

At the time point t4, due to the signal Tx(n+1) going to high level, for each of the pixels 10 of the (n+1)-th row, the charge that has been photoelectrically converted by its photoelectric conversion unit 12 is transferred to its floating diffusion 15. Moreover, at this time point t4, due to the signal Vsws and the signal SEL_S(n+1) both going to high level, the photoelectrically converted signal from each of the pixels 10 of the (n+1)-th row is outputted to the corresponding first vertical signal line 30. The capacitances possessed by the first vertical signal lines 30 accumulate (i.e. store) these photoelectrically converted signals. Furthermore, in the interval from the time point t4 to the time point t5, the noise signal from each of the pixels 10 of the (n+1)-th row that has been stored in the corresponding second vertical signal line 31 is outputted to the corresponding column circuit 90, and is converted by that column circuit into a digital signal.

In the interval from the time point t5 to the time point t8, in a similar manner to the case of the interval from the time point t1 to the time point t3 and the case of the interval from the time point t3 to the time point t5, reading out of the signals from each of the pixels 10 of the (n+2)-th row and A/D conversion processing for conversion of their analog signals to digital signals by the column circuits 90 are performed in parallel.

As explained above, in this embodiment, during the interval while the signals from the pixels 10 are being read out by one of the sets of vertical signal lines, A/D conversion processing is being performed for the signals from the pixels that have been accumulated in the other set of vertical pixel lines. By performing the A/D conversion processing in parallel in this manner during the interval in which reading out from the pixels 10 is taking place, it is possible to shorten the time period required for reading out from all of the pixels 10. And it is possible to implement reading out at a high frame rate by shortening this time period required for reading out.

According to the embodiment described above, the following beneficial operational effects are obtained.

(1) The image sensor 3 comprises the photoelectric conversion units 12 that convert incident light into charges, the plurality of pixels 10 that are arranged along the first direction, the first signal lines that are connected to the plurality of pixels 10 and output first signals from the pixels 10, and the second signal lines that are connected to the plurality of pixels 10 and output second signals from the pixels 10. In this embodiment, a first vertical signal line 30 and a second vertical signal line 31 are provided for each of the pixel columns. Due to this, it is possible to read out the photoelectrically converted signals and the noise signals from the pixels 10 to different vertical signal lines, and it is possible to employ the vertical signal lines as capacitors for accumulating the signals. As a result, it is possible to obtain large capacitance values without causing increase of the chip area.

(2) The first signal is a signal generated due to charge converted by the photoelectric conversion unit 12, and the second signal is a noise signal. The first signal line accumulates the signal generated due to the charge, and the second signal line accumulates the noise signal. Since this is done, accordingly it is possible to employ the first vertical signal line 30 as capacitor that accumulates the photoelectrically converted signal, and likewise it is possible to employ the second vertical signal line 31 as capacitor that accumulates the noise signal.

(3) The pixel 10 comprises the readout unit 20 that reads out the signal generated by the charge to the first signal line, and that reads out the noise signal to the second signal line. Since this is done, accordingly it is possible to read out the photoelectrically converted signal and the noise signal from each of the pixels 10.

(4) The readout unit 20 comprises the first selection switch unit 17 that outputs the first signal to the first signal line, and the second selection switch unit 18 that reads out the second signal to the second signal line. Since this is done, accordingly it is possible selectively to read out the photoelectrically converted signal to the first vertical signal line 30, and also it is possible selectively to read out the noise signal to the second vertical signal line 31.

(5) The current source 60 that supplies current to the readout units 20 is provided to the plurality of pixels 10 in common. Since this is done, accordingly it is possible to reduce the current consumption, as compared with a case in which a current source is provided for each of the pixels.

(6) There are provided the plurality of second switch units (the first switch units 70) that are connected between the first signal lines and the current sources 60, and the plurality of third switch units (the second switch units 80) which are connected between the second signal lines and the current sources 60. Since this is done, accordingly it is possible to control the supply of current to the first vertical signal lines 30 and to the second vertical signal lines 31.

(7) The current source 60 supply current to the first signal line during reading out by the readout units 20 of the signals generated due to the charges from the pixels 10, and also supply current to the second signal line during reading out by the readout units 20 of the noise signals from the pixels 10. Since this is done, accordingly it is possible to read out the photoelectrically converted signals and the noise signals from the first vertical signal line 30 and the second vertical signal line 31 respectively, and it is possible to cause charge accumulation to be performed in the first vertical signal line 30 and the second vertical signal line 31.

(8) The readout unit 20 comprises the accumulation unit (i.e. the floating diffusion 15) that accumulates the charge, the transfer unit 13 that transfers the charge converted by the photoelectric conversion unit 12 to the accumulation unit 15, the discharge unit 14 that discharges the charge accumulated by the accumulation unit 15, and the amplification unit 16 that amplifies the signal due to the charge accumulated by the accumulation unit 15. Since this is done, accordingly it is possible to read out the photoelectrically converted signal from each of the pixels 10 on the basis of the charge that has been photoelectrically converted by the photoelectric conversion unit 12.

(9) The readout unit 20 reads out the noise signal to the second signal line while the charge is discharged by the discharge unit 14. Since this is done, accordingly it is possible to read out the noise signal from each of the pixels 10 when the potential of the floating diffusion 15 is reset to the reset potential.

(10) The photoelectric conversion unit 12 upon the first surface 201*a* of the semiconductor substrate 200 converts the incident light into charge; the readout unit 20 upon the second surface 201*b* of the semiconductor substrate 200, which is different from its first surface 201*a*, reads out the signal generated by the charge and the noise signal; and the first signal line and the second signal line are provided in the pixel region of the second surface 201*b* and as laminated upon the second surface 201*b*. In this embodiment, the first vertical signal line 30 and the second vertical signal line 31 are provided as laminated upon the second surface 201*b* of the semiconductor substrate 200 in the pixel region. Moreover, in this embodiment, since the vertical signal line is also employed as capacitor, accordingly it is possible to obtain large capacitance value without entailing increase of the chip area. Furthermore, it is possible further to reduce the chip area by employing a backside illuminated type image sensor.

(11) The first signal line and the second signal line extend in the first direction. In this embodiment, the first vertical signal line 30 and the second vertical signal line 31 are formed to extend in the column direction, which corresponds to the pixel column. Due to this, it is possible to obtain large capacitance corresponding to the length of the signal line and so on.

(12) Wiring to which a constant potential is applied (the shield lines 120*a* through 120*c*) is further provided between the first signal line and the second signal line. Since this is done, accordingly it is possible to suppress crosstalk between the first vertical signal line 30 and the second vertical signal line 31.

(13) The image sensor 3 comprises the photoelectric conversion unit 12 that converts incident light into charge, the plurality of pixels 10 that are arranged along the first direction, the signal line that is connected to the plurality of pixels 10 and that outputs signal from the pixel 10 generated by charge converted by the photoelectric conversion unit 12, and capacitor, constituted by the conductor that constitutes the signal line and other conductor, that stores the signal outputted to the signal line. Since this is done, accordingly it is possible to cause signal to be accumulated in the vertical signal line. Due to this, it is possible to obtain a large capacitance value without entailing increase in the chip area.

The Second Embodiment

In an image sensor according to the second embodiment, the principal difference from the first embodiment is the feature that, instead of the current sources 60 of the first embodiment, a current source 19 is provided for each of the pixels 10. It should be understood that, in the figures, the same reference symbols are appended to portions that are the same as, or that are equivalent to, corresponding portions in the first embodiment, and the explanation will principally concentrate upon the features of difference.

Figure 6:
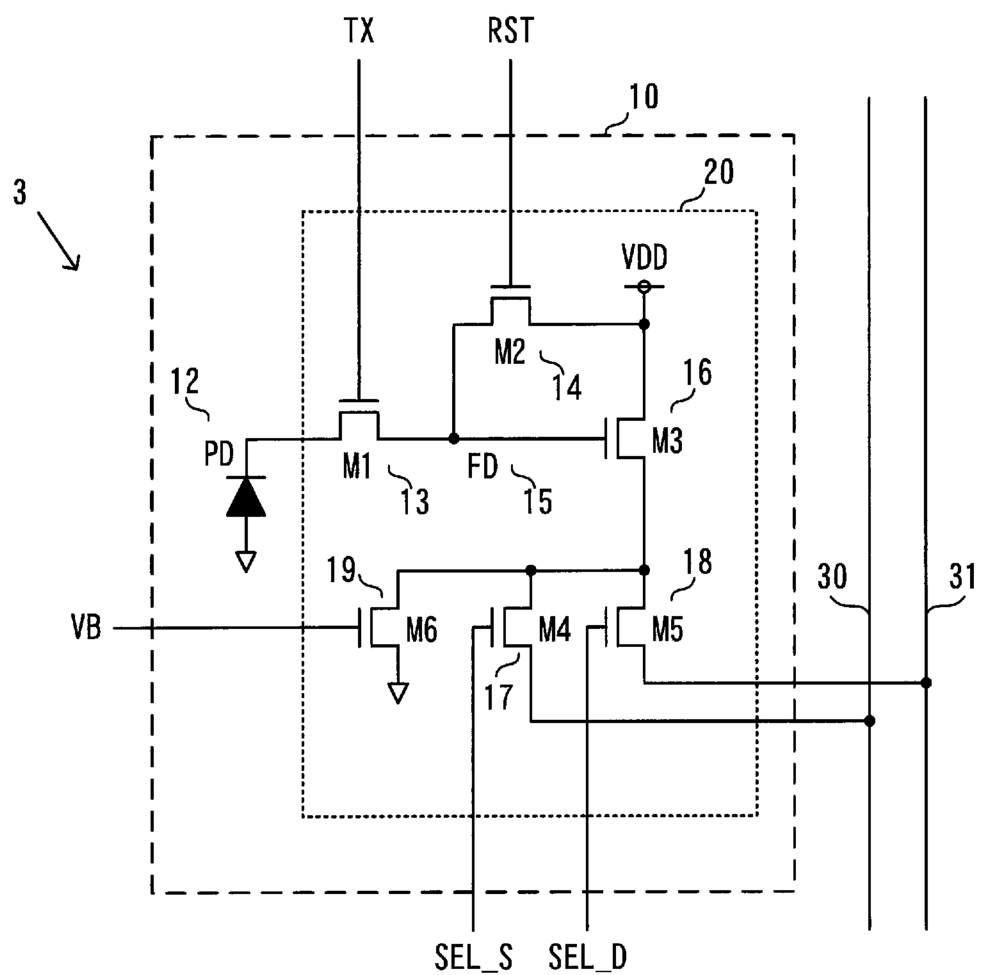
FIG. 6 is a circuit diagram showing the structure of a pixel according to a second embodiment.

FIG. 6 is a circuit diagram showing the structure of a pixel 10 according to the second embodiment. In this second embodiment, the readout unit 20 of the pixel 10 includes a current source 19. A current source 19 is provided for each of the pixels 10 and generates current on the basis of the voltage of a signal VB and supplies this current that has generated to the amplification unit 16. The current source 19 may, for example, comprise a transistor M6.

Figure 7:
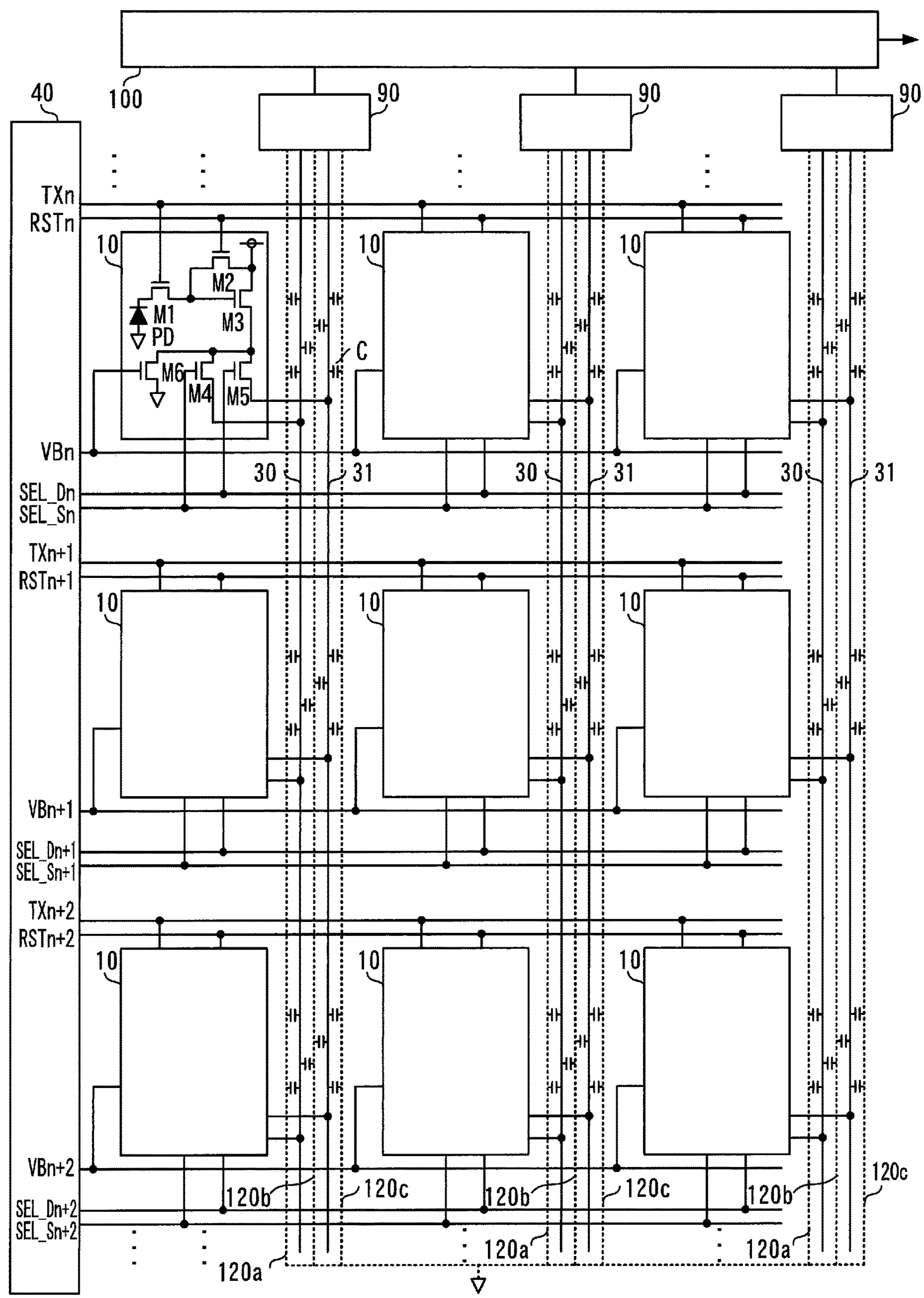
FIG. 7 is a circuit diagram showing the structure of a part of an image sensor according to the second embodiment.

FIG. 7 is a circuit diagram showing the structure of a part of the image sensor 3 according to the second embodiment. The vertical scanner circuit 40 generates signal VBn and supplies it to each of the pixels 10. The current source 19 of each of the pixels 10 generates current according to the voltage level of the signal VB outputted from the vertical scanner circuit 40. It should be understood that the "n" at the tail end of the symbol "VBn" represents the row number of its pixel.

Figure 8:
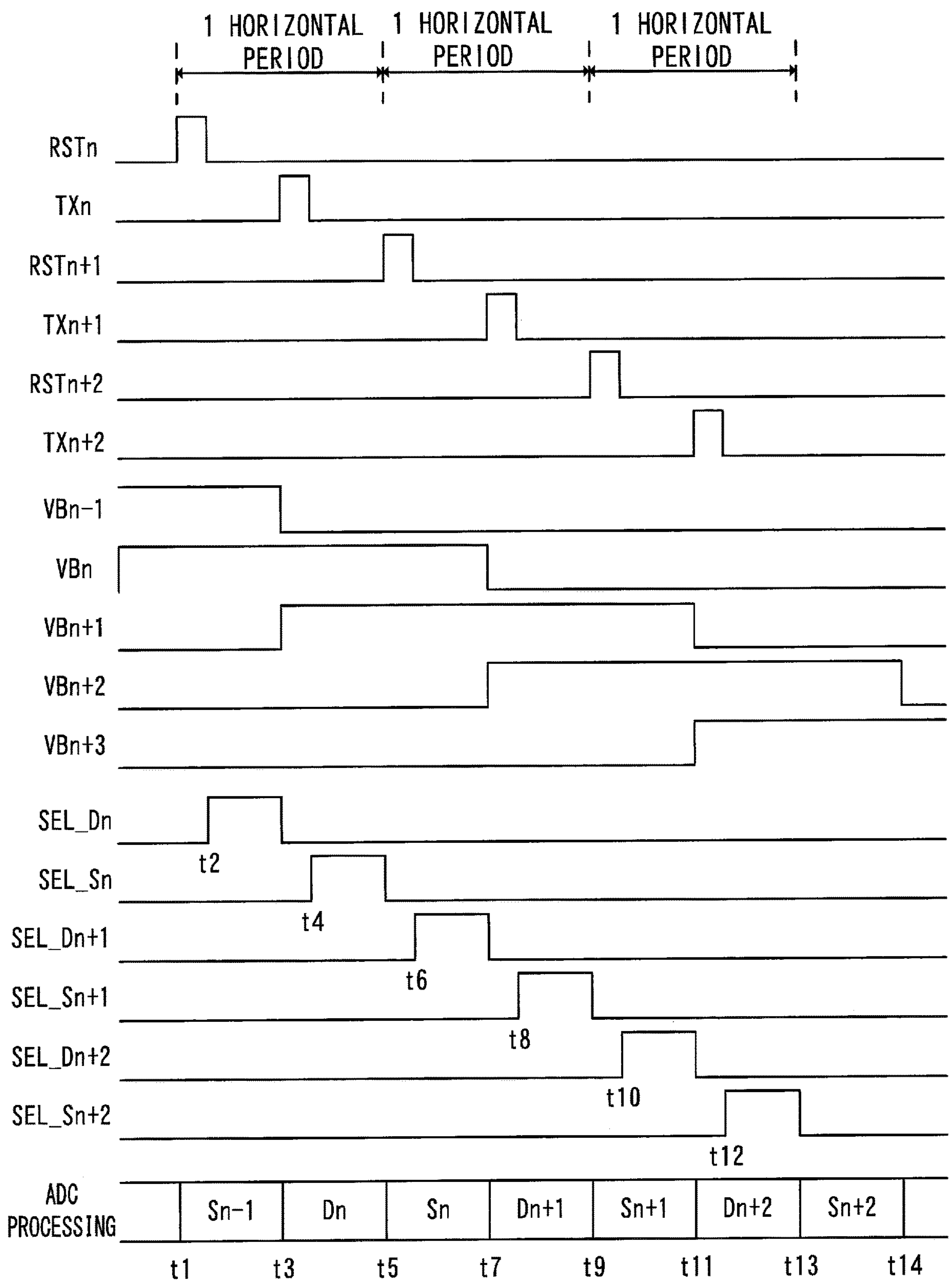
FIG. 8 is a timing chart showing an example of operation of the image sensor according to the second embodiment.

FIG. 8 is a timing chart showing an example of operation of the image sensor 3 according to the second embodiment. In FIG. 8, time is shown along the horizontal axis. In the timing chart shown in FIG. 8, the current source 19 performs supply of current when the signal VB is at high level, in other words when the signal VB is set to a predetermined voltage level. Moreover, when the signal VB is at low level (for example, ground potential), then the current source 19 does not perform supply of current. Each of the time intervals from the time point t1 to the time point t5, from the time point t5 to the time point t9, and from the time point t9 to the time point t13 represents one horizontal period.

At the time point t1, due to the signal RSTn going to high level, in each of the pixels 10 of the n-th row, the potential of the floating diffusion 15 is set to the reset potential. Moreover, during the interval from the time point t1 to the time point t3, since the signal VB(n−1) and the signal VBn are at high level, accordingly, in each of the pixels 10 of the (n−1)-th row (not shown in the figures) and in each of the pixels 10 of the n-th row, the current source 19 generates current according to the signal level (i.e. the voltage) of the signal VB, and the current that is thus generated is supplied to the amplification unit 16. Moreover, at the time point t2, due to the signal SEL_D going to high level, the noise signal of each of the pixels 10 of the n-th row is outputted to the second vertical signal line 31 by the amplification unit 16 and the second selection switch unit 18. The capacitance appended to the second vertical signal line 31 accumulates (i.e. store) the noise signal.

At the time point t3, due to the signal TXn going to high level, in each of the pixels 10 of the n-th row, the charge that has been photoelectrically converted by the photoelectric conversion unit 12 is transferred to the floating diffusion 15. Moreover, at this time point t3, due to the signal VB(n−1) going to low level and the signal VB(n+1) going to high level, in each of the pixels 10 of the (n−1)-th row, supply of current to the amplification unit 16 by the current source 19 is stopped. Moreover, in each of the pixels 10 of the (n+1)-th row, supply of current to the amplification unit 16 by the current source 19 is started. Before reading out of the signal from each of the pixels 10 of the (n+1)-th row is performed, in each of the pixels 10 of the (n+1)-th row, the supply of current by the current source 19 is started. And, at the time point 4, due to the signal SEL_Sn going to high level, the photoelectrically converted signal of each of the pixels 10 of the n-th row is outputted to the first vertical signal line 30 by the amplification unit 16 and the first selection switch unit 17. The capacitance appended to the first vertical signal line 30 accumulates (i.e. store) the photoelectrically converted signal. Furthermore, in the interval from the time point t3 until the time point t5, the noise signal from each of the pixels 10 of the n-th row that was stored in the second vertical signal line 31 is converted into the digital signal which is outputted to the column circuit 90.

At the time point t5, due to the signal RST(n+1) going to high level, in each of the pixels 10 of the (n+1)-th row, the potential of the floating diffusion 15 go to the reset potential. Moreover, at the time point t6, due to the signal SEL_D(n+1) going to high level, the noise signal of each of the pixels 10 of the (n+1)-th row is outputted to the second vertical signal line 31 by the amplification unit 16 and the second selection switch unit 18. The capacitance possessed by the second vertical signal line 31 accumulates (i.e. store) the noise signal. Furthermore, in the interval from the time point t5 until the time point t6, the photoelectrically converted signal from each of the pixels 10 of the n-th row that was stored in the first vertical signal line 30 is converted into the digital signal which is outputted to the column circuit 90.

At the time point t7, due to the signal Tx(n+1) going to high level, in each of the pixels 10 of the (n+1)-th row, the charge that has been photoelectrically converted by the photoelectric conversion unit 12 is transferred to the floating diffusion 15. Moreover, due to the signal VBn going to low level at the time point t7, in each of the pixels 10 of the n-th row, the supply of current to the amplification unit 16 by the current source 19 ends. In other words, at a predetermined time period (for example, after half of one horizontal period) after the signal SEL_Sn goes to low level at the time point t5 and the reading out of the signal from each of the pixels 10 of the n-th row ends, the supply of current by the current source 19 of each of the pixels 10 of the n-th row ends. Furthermore, at the time point t7, due to the signal VB(n+2) going to high level, in each of the pixels 10 of the (n+2)-th row, the supply of current to the amplification unit 16 by the current source 19 starts. And, before reading out of the signal from each of the pixels 10 of the (n+2)-th row is performed, in each of the pixels 10 of the (n+2)-th row, the supply of current by the current source 19 starts.

At the time point t8, due to the signal SEL_S(n+1) going to high level, the photoelectrically converted signal of each of the pixels 10 of the (n+1)-th row is outputted by the amplification unit 16 and the first selection switch unit 17 to the first vertical signal line 30. The capacitance possessed by the first vertical signal line 30 accumulates (i.e. store) the photoelectrically converted signal. Furthermore, in the interval from the time point t7 until the time point t9, the noise signal from each of the pixels 10 of the (n+1)-th row that was stored in the second vertical signal line 31 is converted into the digital signal which is outputted to the column circuit 90.

At the time point t9, due to the signal RST(n+2) going to high level, in each of the pixels 10 of the (n+2)-th row, the potential of the floating diffusion 15 goes to the reset potential. Moreover, at the time point t10, due to the signal SEL_D(n+2) going to high level, the noise signal of each of the pixels 10 of the (n+2)-th row is outputted by the amplification unit 16 and the second selection switch unit 18 to the second vertical signal line 31. The capacitance possessed by the second vertical signal line 31 accumulates (i.e. store) the noise signal. Furthermore, in the interval from the time point t9 until the time point t11, the photoelectrically converted signal from each of the pixels 10 of the (n+1)-th row that was stored in the first vertical signal line 30 is converted into the digital signal which is outputted to the column circuit 90.

At the time point t11, due to the signal Tx(n+2) going to high level, in each of the pixels 10 of the (n+2)-th row, the charge that has been photoelectrically converted by the photoelectric conversion unit 12 is transferred to the floating diffusion 15. Moreover, due to the signal VB(n+1) going to low level at the time point t11, in each of the pixels 10 of the (n+1)-th row, the supply of current to the amplification unit 16 by the current source 19 ends. In other words, at a predetermined time period after the reading out of the signal from each of the pixels 10 of the (n+1)-th row ends, the supply of current by the current source 19 ends. Furthermore, at the time point t11, due to the signal VB(n+3) going to high level, in each of the pixels 10 of the (n+3)-th row, the supply of current to the amplification unit 16 by the current source 19 starts.

At the time point t12, due to the signal SEL_S(n+2) going to high level, the photoelectrically converted signal of each of the pixels 10 of the (n+2)-th row is outputted by the amplification unit 16 and the first selection switch unit 17 to the first vertical signal line 30. The capacitance appended to the first vertical signal line 30 accumulates (i.e. store) the photoelectrically converted signal. Furthermore, in the interval from the time point t11 until the time point t13, the noise signal from each of the pixels 10 of the (n+2)-th row that was stored in the second vertical signal line 31 is converted into the digital signal which is outputted to the column circuit 90. And, in the interval from the time point t13 until the time point t14, the photoelectrically converted signal of each of the pixels 10 of the (n+2)-th row which was stored in the first vertical signal line 30 is converted into the digital signal which is outputted to the column circuit 90.

In the first embodiment, in order to suppress errors between the photoelectrically converted signals read out from the pixels 10 and the photoelectrically converted signals accumulated in the first vertical signal lines 30, the first selection switch units 17 and the first switch units 70 were turned off simultaneously. Moreover, in order to suppress errors between the noise signals read out from the pixels 10 and the noise signals accumulated in the second vertical signal lines 31, the second selection switch units 18 and the second switch units 80 were turned off simultaneously. By contrast, in this second embodiment, by providing the current source 19 within each of the pixels 10, it is possible for the timings at which the signals are read out to the first vertical signal lines 30 and to the second vertical signal lines 31 and are accumulated therein to be controlled only by the turning on and off of the first selection switch units 17 and the second selection switch units 18. Due to this, as compared with the first embodiment, it is possible to perform the timing control when reading out and accumulating the signals from the pixels 10 in a simple and easy manner. And, due to this, it is possible to avoid the occurrence of errors in the signals stored in the first vertical signal lines 30 and in the second vertical signal lines 31.

Furthermore, in this embodiment, while the signals of the pixels 10 of some row are being read out, the supply of current by the current sources 19 of the pixels 10 of another row is started. Moreover, after a predetermined time period from when the reading out of the signals from the pixels 10 is ended, the supply of current by the current sources 19 of those pixels 10 is ended. Due to this, for example, supply of current is performed by the current sources 19 of the pixels 10 of the n-th row and of the (n+1)-th row in the period from the time point t3 until the time point t7, and supply of current is performed by the current sources 19 of the pixels 10 of the (n+1)-th row and of the (n+2)-th row in the period from the time point t7 until the time point t11. Due to this, it is possible to ensure a sufficient setting time period for the current sources 19 to settle down. Moreover it is possible to reduce the consumption of current, since in these time periods supply of current is only performed by the current sources 19 of the pixels 10 in these two rows. Furthermore it is possible to ensure that the current that flows in the ground wiring is constant, due to the fact that, in the period in which readout is being performed from each of the pixels 10, only the current sources 19 of the pixels 10 in these two rows are being driven. Because of this, it is possible to suppress fluctuations of the potential of the ground wiring, and it is possible to suppress noise mixing into the signals from the pixels 10.

Figure 9:
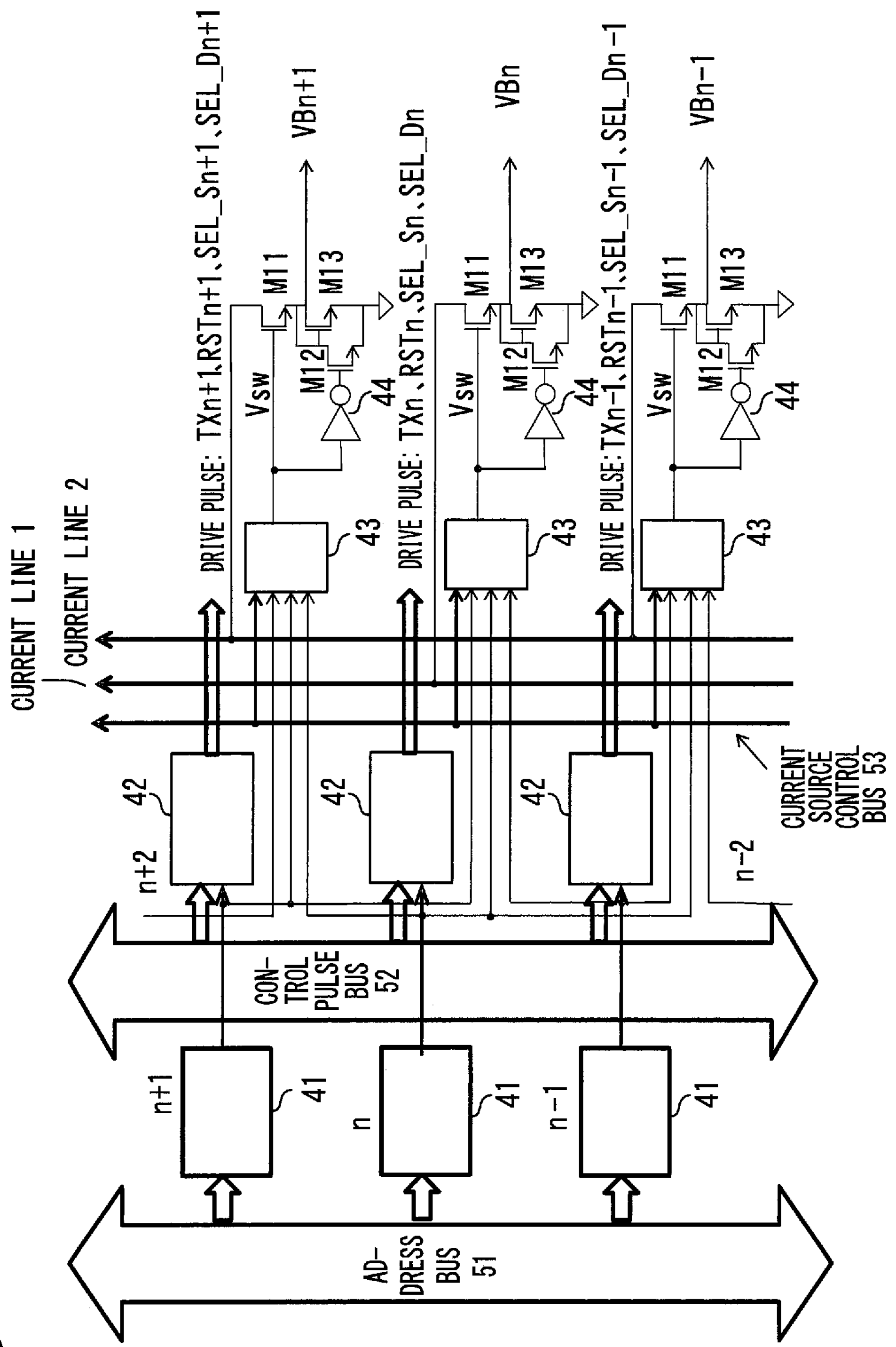
FIG. 9 is a figure showing an example of a vertical scanner circuit of the image sensor according to the second embodiment.

FIG. 9 is a figure showing an example of the structure of the vertical scanner circuit 40 of the image sensor according to the second embodiment. The vertical scanner circuit 40 comprises an address decoder 41, a pulse generation unit 42, a synthesis circuit 43, an inverter circuit 44, and transistors M11, M12, and M13, and each of these vertical scanner circuits 40 is provided to each of the rows of pixels 10.

The address decoder 41 decodes a signal from an address bus 51 and generates an address signal, which is outputted to the pulse generation unit 42 and to the synthesis circuit 43. And, using the signal from the address decoder 41 and a signal from a control bus 52, the pulse generation unit 42 generates signal for controlling the operation of the pixels 10 (for example the signals TXn and so on), and outputs the signal to the pixels 10. Using the signal from the address decoder 41 and a signal from a current source control bus 53, the synthesis circuit 43 generates the signal Vsw for controlling the transistor M11 to on and off, and outputs this signal to the transistor M11 and to the inverter circuit 44.

The inverter circuit 44 inputs the signal Vsw, and outputs a signal Vswb which is the inverse of the signal Vsw. The transistor M11 functions as a switch that changes over the state of electrical connection between a current line 1 or a current line 2 (hereinafter referred to generically as "current lines") and the transistor M13. By the signal Vsw going to high level and the signal Vswb thus going to low level, the transistor M11 goes to on and the transistor M12 goes to off, and the transistor M13 generates a signal VB having a voltage level based upon a reference current from the current line and supplies this signal VB to the pixels 10. The transistor M13 functions as a voltage supply unit that supplies the voltage based upon the reference current to the current source 19 of each of the pixels 10. The gate width of the transistor M13 may, for example, be N times the gate width of the transistor M6 of which the current source 19 consists, and the current source 19 may generate currents corresponding to the ratio of the gate width of the transistor M13 to the gate width of the transistor M6.

Figure 10:
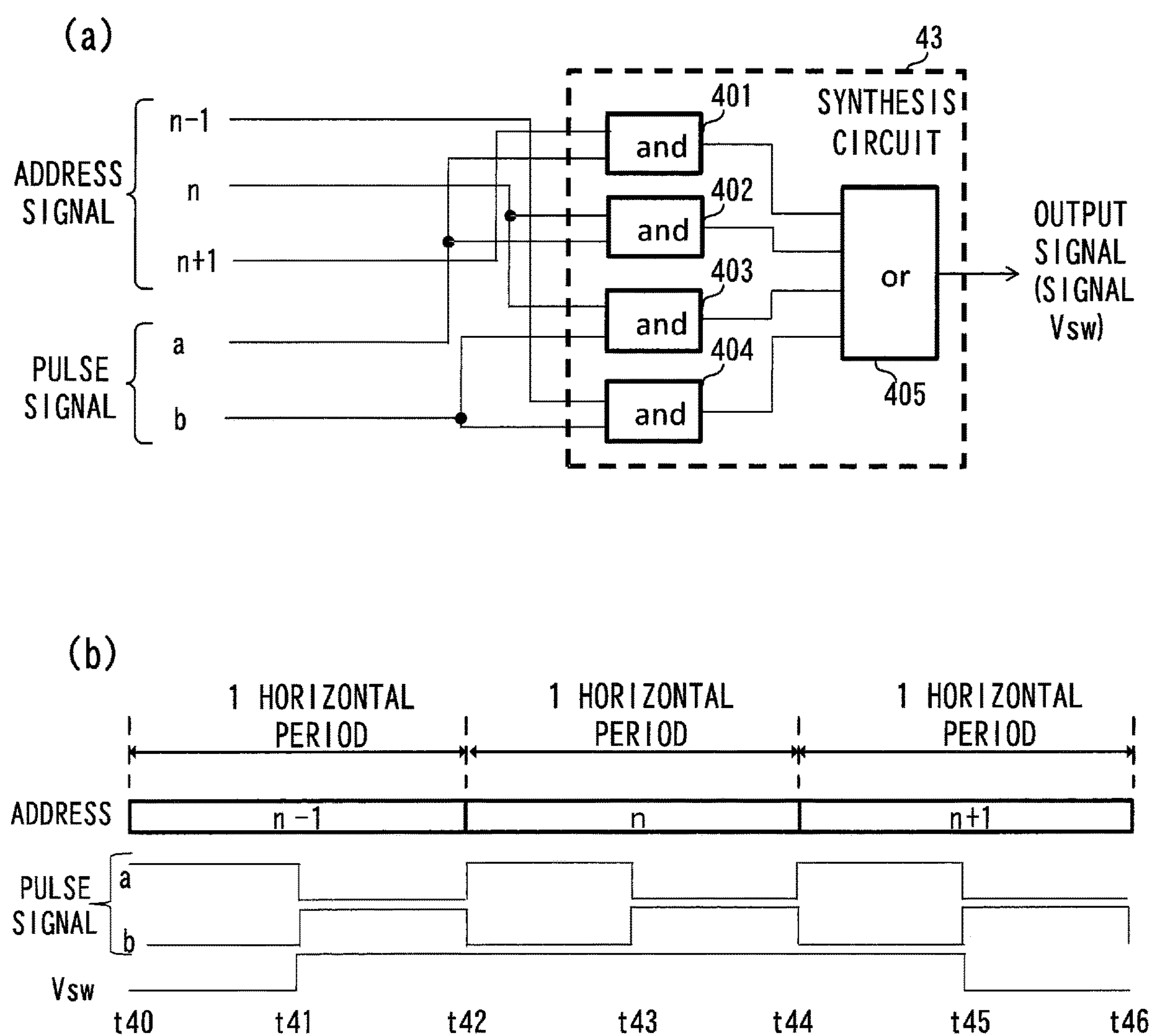
FIG. 10(*a*) is a figure showing an example of the structure of a synthesis circuit of the image sensor according to the second embodiment, and FIG. 10(*b*) is a timing chart showing an example of operation of the synthesis circuit of the image sensor according to the second embodiment.

FIG. 10(*a*) is a figure showing an example of the structure of the synthesis circuit 43 of the image sensor according to the second embodiment. This synthesis circuit 43 is built from logic circuits that include AND circuits 401 through 404 and an OR circuit 405. The AND circuits 401 through 404 input the signal from the address decoder 41 and the signal from the current source control bus 53. In FIG. 10, the signals (n−1), n, and (n+1) are address signals from the address decoder 41, and the signals a and b are signals from the current source control bus 53.

FIG. 10(*b*) is a timing chart showing an example of operation of this synthesis circuit 43 of the image sensor according to the second embodiment. From the time point t40 to the time point t42, the address signal (n−1) goes to high level, and reading out of the signal from each of the pixels 10 of the (n−1)-th row is performed. From the time point t42 to the time point t44, the address signal n goes to high level, and reading out of the signal from each of the pixels 10 of the n-th row is performed. And, from the time point t44 to the time point t46, the address signal (n+1) goes to high level, and reading out of the signal from each of the pixels 10 of the (n+1)-th row is performed. Each of the intervals from the time point t40 to the time point t42, from the time point t42 to the time point t44, and from time point t44 to the time point t46 is one horizontal period.

During the interval from the time point t40 to the time point t41, the address signal (n−1) is at high level, the signal a is at high level, and the signal b is at low level, and the synthesis circuit 43 performs signal synthesis with the logic circuits and outputs the signal Vsw at low level. And, during the interval from the time point t41 to the time point t42, the address signal (n−1) is at high level, the signal a is at low level, and the signal b is at high level, and the synthesis circuit 43 outputs the signal Vsw at high level. Moreover, during the interval from the time point t42 to the time point t43, the address signal n is at high level, the signal a is at high level, and the signal b is at low level, and the synthesis circuit 43 outputs the signal Vsw at high level.

Furthermore, during the interval from the time point t43 to the time point t44, the address signal n is at high level, the signal a is at low level, and the signal b is at high level, and the synthesis circuit 43 outputs the signal Vsw at high level. And, during the interval from the time point t44 to the time point t45, the address signal (n+1) is at high level, the signal a is at high level, and the signal b is at low level, and the synthesis circuit 43 outputs the signal Vsw at high level. Moreover, during the interval from the time point t45 to the time point t46, the address signal (n+1) is at high level, the signal a is at low level, and the signal b is at high level, and the synthesis circuit 43 outputs the signal Vsw at low level.

The synthesis circuit 43 outputs the signal Vsw that has thus been generated to the transistor M11 and to the inverter circuit 44 shown in FIG. 9. When the signal Vsw goes to high level, the transistor M11 goes to on, and the transistor M13 generates a signal VB having a voltage level based upon the reference current from the current line, and outputs this signal VB to the current source 19 of each of the pixels 10. The current sources 19 then starts supply of current according to the voltage level of the signal VB. Moreover, when the signal Vsw goes to low level, the transistor M11 goes to off. When the signal Vsw goes to low level, the signal Vswb goes to high level, and the transistor M12 goes to on. At this time, the signal level of the signal VB becomes ground potential.

In this manner, before the address signal n goes to high level, and while the signals from the pixels 10 in the (n−1)-th row are being read out, the signal Vsw goes to high level. Due to this, it is possible to start the supply of current by the current sources 19 before the reading out of the signals from the pixels 10 in the n-th row starts. Moreover, the signal Vsw goes to low level after the predetermined time period from when the address signal n goes to low level, in other words after the predetermined time period from when the reading out of the signals from the pixels 10 in the n-th row ends. Due to this, it is possible to terminate the supply of current by the current sources 19 after the predetermined time period from when the reading out of the signals from the pixels 10 in the n-th row ends.

According to the embodiment described above, in addition to beneficial operational effects that are similar to those obtained with the first embodiment, the following further beneficial operational effects are obtained.

(14) A current source 19 that supplies current to the readout unit 20 is provided for each of the pixels 10. Since this is done, accordingly it is possible to perform timing control in a simple and easy manner when reading out and accumulating the signals from the pixels. Moreover, it is possible to suppress the occurrence of errors in the signals that are stored in the first vertical signal lines and in the second vertical signal lines.

(15) The plurality of pixels 10 include the first pixels and the second pixel that is the subject of next being read out after the first pixel, and the current source 19 that is provided to the second pixel starts the supply of current to the readout unit 20 of the second pixel while the signal generated due to the charge from the first pixel is being read out. Since this is done, accordingly it is possible to ensure a certain setting time for the current source 19 to stabilize. Moreover, it is possible to reduce the consumption of current.

(16) The voltage supply unit (i.e. the transistor M13) that generates voltage on the basis of the reference current and supplies the voltage thus generated to the current source 19 is provided for each of the plurality of pixels. Since this is done, accordingly it is possible to control the supply of current to the readout unit 20 by the current source 19 for each row of pixels 10.

The Third Embodiment

With the image sensor according to a third embodiment, the principal difference from the second embodiment is the feature that, in addition to the current source 19 of the second embodiment, a third switch unit 21 is provided for each of the pixels 10. It should be understood that, in the figures, the same reference symbols are appended to portions that are the same as, or are equivalent to, corresponding portions in the first and second embodiments, and the explanation will principally concentrate upon the features of difference.

Figure 11:
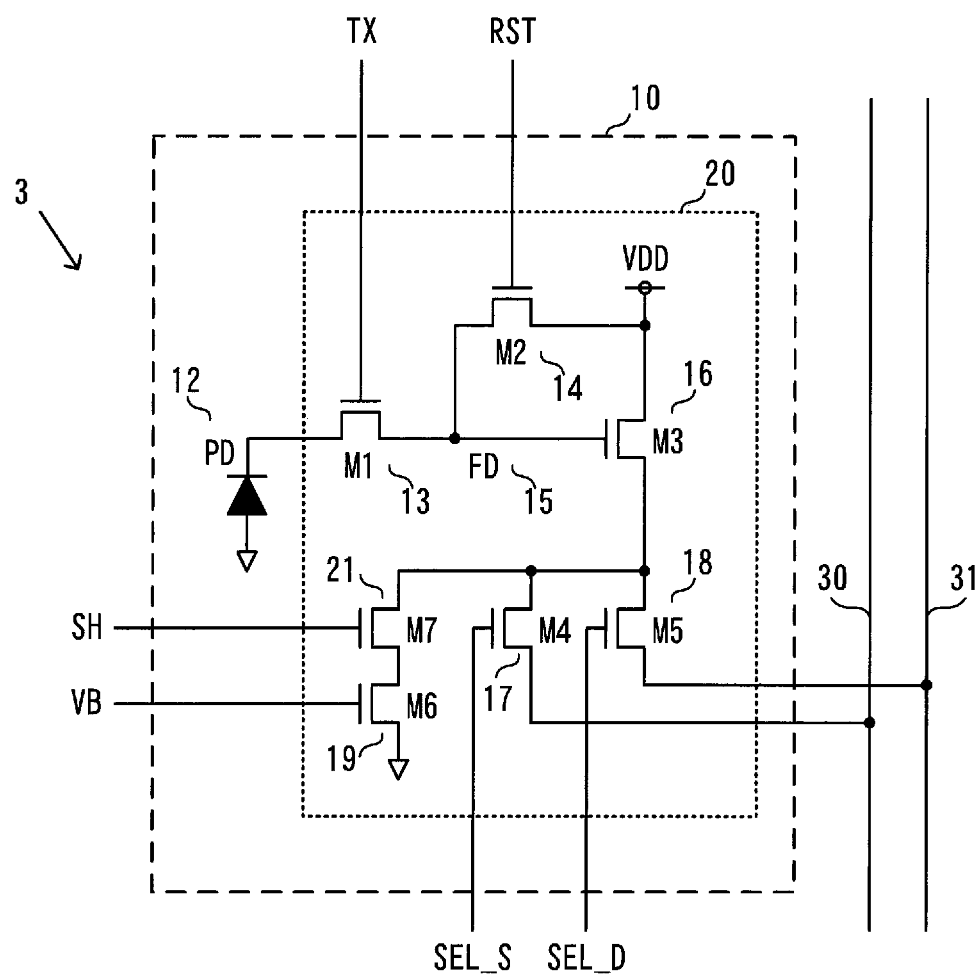
FIG. 11 is a circuit diagram showing the structure of a pixel according to a third embodiment.

FIG. 11 is a circuit diagram showing the structure of one of the pixels 10 according to this third embodiment. In the third embodiment, a structure is adopted in which the readout unit 20 includes the third switch unit 21. The third switch unit 21 is controlled by a signal SH, and changes over the state of electrical connection between the current source 19 and the amplification unit 16. In this embodiment, the signal VB of a predetermined voltage level is always supplied to the current source 19 while all of the pixels 10 are being read out, so that the current source 19 is put into the state in which it is capable of supplying current. Due to this, the supply of current to the amplification unit 16 by the current source 19 is started and stopped according to the on/off control of the third switch unit 21. And, because of this it is possible to shorten the setting time for stabilizing the current source 19, and it is possible to start supply of current by the current source 19. The third switch unit 21 may, for example, include transistor M7.

Figure 12:
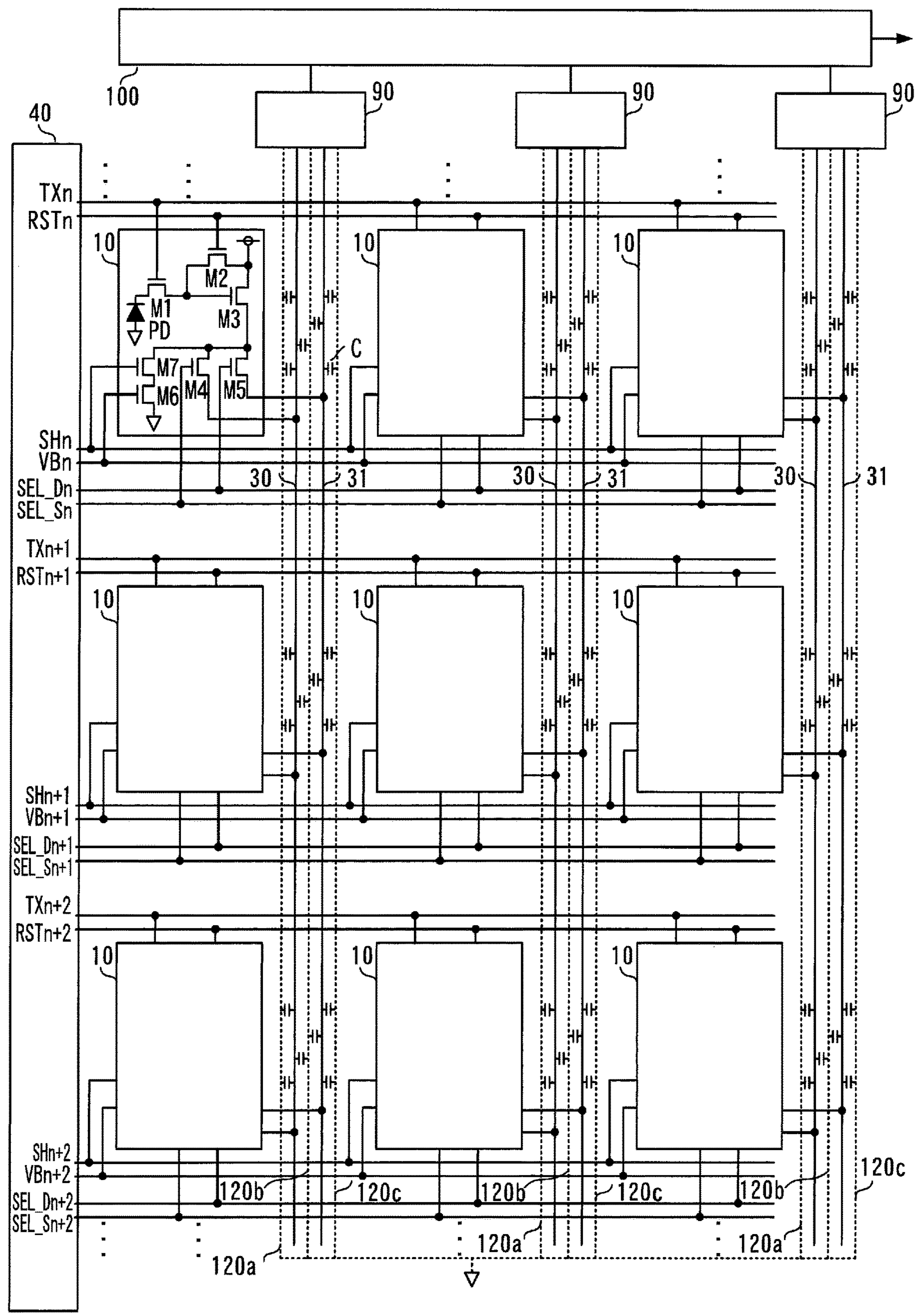
FIG. 12 is a circuit diagram showing a part of the structure of an image sensor according to this third embodiment.

FIG. 12 is a circuit diagram showing a part of the structure of an image sensor 3 according to the third embodiment. A vertical scanner circuit 40 generates signal SHn and supplies it to the pixels 10. The third switch unit 21 of each of the pixels 10 is controlled by this signal SHn outputted from the vertical scanner circuit 40. It should be understood that the "n" at the tail end of the symbol "Shn" represents the row number of its pixel.

Figure 13:
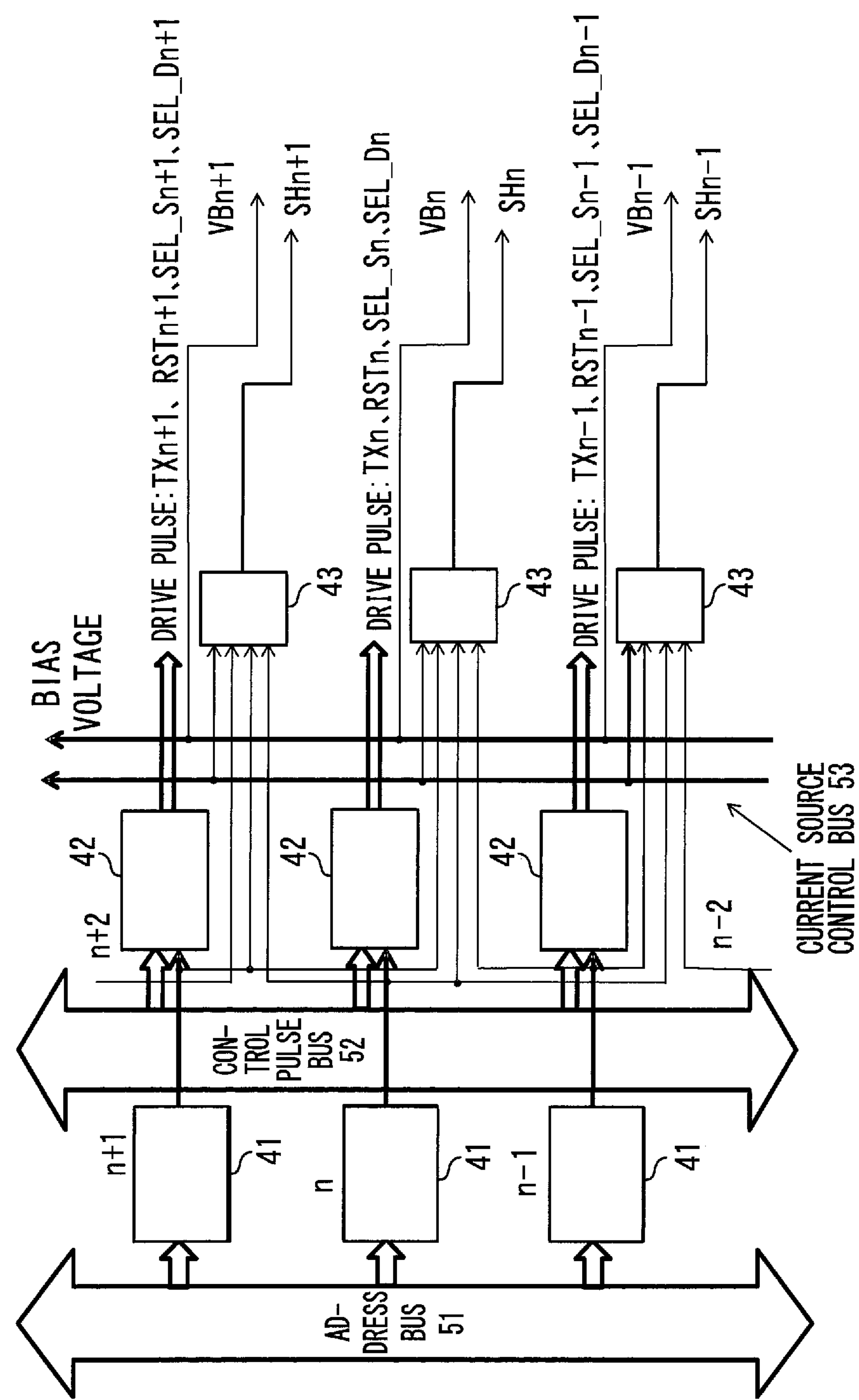
FIG. 13 is a figure showing an example of the structure of a vertical scanner circuit of an image sensor according to the third embodiment.

FIG. 13 is a figure showing an example of the structure of the vertical scanner circuit 40 of this image sensor according to the third embodiment. The vertical scanner circuit 40 according to this third embodiment always supplies a signal VB of a predetermined bias voltage to each of the current sources 19 of all of the pixels 10 during the period that all of the pixels 10 are being read out. Moreover, a synthesis circuit 43 generates signal SHn on the basis of the signal from the address decoder 41 and a signal from the current source control bus 53, and outputs it to the third switch unit 21 of each of the pixels 10. It should be understood that the timing at which the third switch unit 21 is turned on by the signal SHn is the same as the timing at which generation of current by the current source 19 due to the signal VBn is started, shown in FIG. 8. Moreover, the timing at which the third switch unit 21 is turned off by the signal SHn is the same as the timing at which generation of current by the current source 19 due to the signal VBn is ended, shown in FIG. 8.

According to the embodiment described above, in addition to beneficial effects that are similar to those obtained with the first and second embodiments, the following further beneficial operational effect is obtained.

(17) The image sensor 3 further comprises the plurality of first switch units (i.e. the third switch units 21) which start and stop the supply of current by the current source 19. The first switch unit is provided for each of the pixels 10. Due to this, it is possible to start and stop the supply of current by the current source 19 by performing on/off control of the third switch unit 21. Moreover, in this embodiment, the signal VB which serves as a predetermined bias voltage is always supplied to the current source 19 during the period in which, for example, readout is being performed from all of the pixels 10. Due to this, it is possible to shorten the setting time for stabilizing the current source 19, and it is possible to start supply of current by the current source 19.

The following variants are also to be considered as coming within the scope of the present invention; and it would also be possible to combine one or more of these variant embodiments with one or a plurality of the embodiments described above.

The First Variant Embodiment

Figure 14:
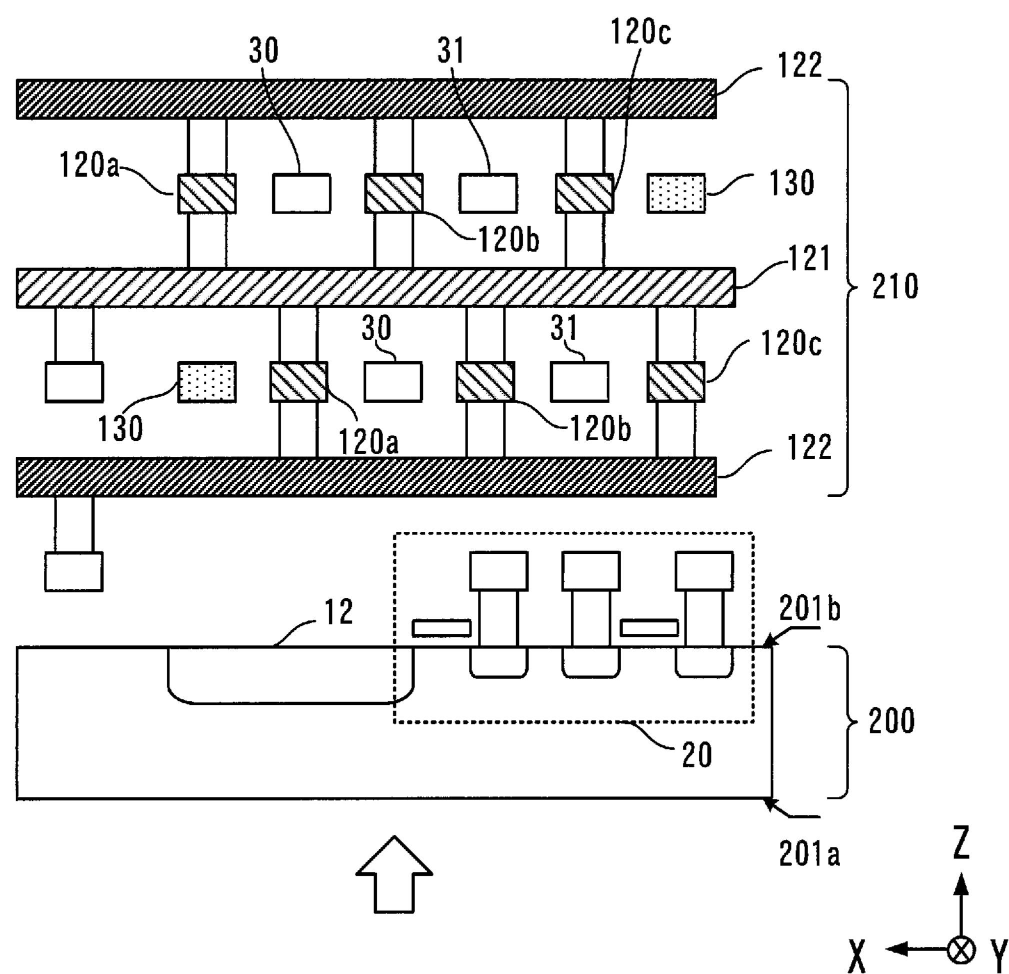
FIG. 14 is a figure showing the cross sectional structure of an image sensor according to a first variant embodiment.

FIG. 14 is a figure showing the cross sectional structure of an image sensor according to the first variant embodiment. As shown in FIG. 14, it is possible to separate the first vertical lines 30 and the second vertical lines 31 between a plurality of layers. In this case, it will be appropriate to separate the shield lines 120*a*, 120*b*, and 120*c* between a plurality of layers as well. Moreover, as shown in FIG. 14, it would also be acceptable to arrange to provide dummy wiring 130 for ensuring the symmetry of the wiring layout of the wiring layer 210.

The Second Variant Embodiment

In the embodiments explained above, examples were described in which photodiode was employed as the photoelectric conversion unit 12. However, it would also be acceptable to arrange to employ a photoelectric conversion layer as the photoelectric conversion units 12.

The Third Variant Embodiment

In the embodiments explained above, examples were described in which the image sensor 3 was of the backside-illuminated type. However, it would also be acceptable to arrange for the image sensor 3 to be of the front-illuminated type, having a wiring layer 210 on its surface upon which light is incident.

The Fourth Variant Embodiment

In the embodiments explained above, examples were described in which each of the first selection switch unit 17, the second selection switch unit 18, the first switch unit 70, and the second switch unit 80 was built around a transistor; but it would also be acceptable to build these elements with optical switches. By providing such a structure, it would be possible to perform on/off control of the first selection switch unit 17, of the second selection switch unit 18, of the first switch unit 70, and of the second switch unit 80 at high speed. By doing this, it would be possible to suppress both errors between the photoelectrically converted signals read out from the pixels 10 and the photoelectrically converted signals accumulated in the first vertical signal lines 30, and also errors between the noise signals read out from the pixels 10 and the noise signals accumulated in the second vertical signal lines 31.

In the above description various embodiments and variant embodiments have been explained, but the present invention is not to be considered as being limited by the details thereof. Other versions that are considered to come within the range of the technical concept of the present invention are also to be understood as being included within its scope.

The content of the disclosure of the following application, upon which priority is claimed, is hereby incorporated herein by reference:

Japanese Patent Application 65,490 of 2016 (filed on 29 Mar. 2016).

REFERENCE SIGNS LIST

3: image sensor
12: photoelectric conversion unit
20: readout unit
30: first vertical signal line
31: second vertical signal line

The invention claimed is:

1. An image sensor, comprising:

a plurality of pixels each having (i) a photoelectric conversion unit that converts light into charge, (ii) a transfer unit that transfers the charge converted by the photoelectric conversion unit, (iii) a floating diffusion to which the charge converted by the photoelectric conversion unit is transferred by the transfer unit, and (iv) a reset unit that resets a potential of the floating diffusion to a reset potential;

a first signal line (i) connected, among the plurality of pixels, to a first pixel and a second pixel arranged side by side in a row direction and (ii) to which a first signal is outputted, the first signal being based upon the potential of the floating diffusion to which the charge has been transferred by the transfer unit from the photoelectric conversion unit;

a second signal line (i) connected to the first pixel and the second pixel and (ii) to which a second signal is outputted before the first signal is outputted to the first signal line, the second signal being based upon the potential of the floating diffusion set to the reset potential by the reset unit;

a column circuit having a conversion unit for converting into digital signals the first signal outputted to the first signal line and the second signal outputted to the second signal line; and a vertical scanner circuit that outputs the first signal and the second signal to the first signal line and the second signal line in order of the first pixel and the second pixel, respectively, among the first pixel and the second pixel, wherein the vertical scanner circuit outputs the second signal of the second pixel to the second signal line when the first signal of the first pixel is converted into a digital signal by the column circuit.

2. The image sensor according to claim 1, wherein the first signal line accumulates the first signal, and the second signal line accumulates the second signal.

3. The image sensor according to claim 1, further comprising:

an amplification unit that has a gate unit connected to the floating diffusion and that outputs the first signal and the second signal;

a first selection switch unit that outputs the first signal from the amplification unit to the first signal line, and a second selection switch unit that outputs the second signal from the amplification unit to the second signal line.

4. The image sensor according to claim 3, further comprising a current source, disposed between the amplification unit and the first selection switch unit, that supplies current to the amplification unit.

5. The image sensor according to claim 4, wherein:

the current source is disposed between the amplification unit and the second selection switch unit.

6. The image sensor according to claim 5, further comprising a control unit that controls supplying the current to the amplification unit by the current source.

7. The image sensor according to claim 6, wherein:

the control unit supplies the current from the current source to the first signal line while the first signal is outputted from the amplification unit to the first signal line, and the control unit supplies the current from the current source to the second signal line while the second signal is outputted from the amplification unit to the second signal line.

8. The image sensor according to claim 1, further comprising:

a first switch unit disposed between the first signal line and the current source; and a second switch unit disposed between the second signal line and the current source.

9. The image sensor according to claim 1, further comprising an electrode, provided between the first signal line and the second signal line, to which a constant potential is applied.

10. The image sensor according to claim 1, further comprising wiring, provided between the first signal line and the second signal line, to which a constant potential is applied.

11. An image capture device, comprising:

the image sensor according to claim 1.

12. The image sensor according to claim 1, wherein:

the vertical scanner circuit outputs the first signal of the second pixel to the first signal line when the second signal of the second pixel is converted into a digital signal by the column circuit.

* * * * *